United States Patent
Jang et al.

(10) Patent No.: US 12,207,465 B2
(45) Date of Patent: Jan. 21, 2025

(54) SEMICONDUCTOR MEMORY DEVICE INCLUDING VERTICAL INSULATING PATTERN INCLUDING A DIFFUSED METAL AND METHOD OF FABRICATING THE SAME

(71) Applicant: Samsung Electronics Co., Ltd., Suwon-si (KR)

(72) Inventors: Byung Chul Jang, Suwon-si (KR); Sang-Yong Park, Suwon-si (KR); Jae Duk Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 329 days.

(21) Appl. No.: 17/211,129

(22) Filed: Mar. 24, 2021

(65) Prior Publication Data

US 2022/0020766 A1 Jan. 20, 2022

(30) Foreign Application Priority Data

Jul. 15, 2020 (KR) .................. 10-2020-0087201

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 41/40* (2023.02); *H10B 43/10* (2023.02); *H10B 43/40* (2023.02)

(58) Field of Classification Search
CPC ........ H10B 43/27; H10B 41/10; H10B 41/27; H10B 41/40; H10B 43/10; H10B 43/40; H10B 43/30; H10B 43/35; H10B 43/50
See application file for complete search history.

(56) References Cited

U.S. PATENT DOCUMENTS 8,907,397 B2 12/2014 Yasuda
9,070,589 B2 6/2015 Kawai et al.
(Continued)

FOREIGN PATENT DOCUMENTS

CN 107808884 A 3/2018
KR 10-0439345 B1 7/2004
(Continued)

OTHER PUBLICATIONS

Zanatta et al. "Low-temperature Al-induced crystallization of amorphous Ge", Journal of Applied Physics, vol. 97, p. 094914 (2005) ( Year: 2005).*

*Primary Examiner* — Kimberly N Rizkallah
*Assistant Examiner* — Zhijun Xu
(74) *Attorney, Agent, or Firm* — HARNESS, DICKEY & PIERCE, P.L.C.

(57) ABSTRACT

A semiconductor memory device includes a stacked structure on a substrate and a vertical structure penetrating the stacked structure. The stacked structured includes a plurality of conductive lines stacked on the substrate. The vertical structure may include a vertical insulating pattern and a channel film extending along sidewalls of the vertical insulating pattern. The vertical insulating pattern may include an inner region and an outer region. The outer region of the vertical insulating pattern may be placed between the channel film and the inner region of the vertical insulating pattern, and the outer region of the vertical insulating pattern may include a diffused metal.

13 Claims, 30 Drawing Sheets

(51) Int. Cl.
    *H10B 41/27*     (2023.01)
    *H10B 41/40*     (2023.01)
    *H10B 43/10*     (2023.01)
    *H10B 43/40*     (2023.01)

(56) References Cited

U.S. PATENT DOCUMENTS

| | | |
|---|---|---|
| 9,287,290 B1 | 3/2016 | Rabkin et al. |
| 9,318,329 B2 | 4/2016 | Kohji et al. |
| 9,627,395 B2 | 4/2017 | Zhang et al. |
| 9,721,963 B1 * | 8/2017 | Rabkin .................. H01L 29/24 |
| 10,325,926 B2 | 6/2019 | Tang et al. |
| 2018/0337087 A1 * | 11/2018 | Sandhu ............. H01L 21/02189 |
| 2019/0157284 A1 * | 5/2019 | Park ....................... H01L 23/535 |
| 2019/0252404 A1 * | 8/2019 | Kaminaga ............... H10B 43/27 |
| 2019/0295956 A1 * | 9/2019 | Kawai .................... G11C 16/08 |
| 2019/0371810 A1 | 12/2019 | Saito et al. |
| 2020/0075609 A1 * | 3/2020 | Morris ................ G11C 11/2275 |
| 2020/0098930 A1 * | 3/2020 | Le ......................... H01L 29/458 |

FOREIGN PATENT DOCUMENTS

| | | |
|---|---|---|
| KR | 10-0543006 B1 | 1/2006 |
| KR | 10-0611224 B1 | 8/2006 |
| KR | 10-0635038 B1 | 10/2006 |
| KR | 10-0635567 B1 | 10/2006 |

\* cited by examiner

SEMICONDUCTOR MEMORY DEVICE INCLUDING VERTICAL INSULATING PATTERN INCLUDING A DIFFUSED METAL AND METHOD OF FABRICATING THE SAME

CROSS-REFERENCE TO RELATED APPLICATION

This application claims priority from Korean Patent Application No. 10-2020-0087201, filed on Jul. 15, 2020 in the Korean Intellectual Property Office, and all the benefits accruing therefrom under 35 U.S.C. 119, the entire contents of which are herein incorporated by reference.

BACKGROUND

1. Technical Field

Embodiments of inventive concepts relate to a semiconductor device and/or a method of fabricating the same, and more particularly, to a three-dimensional semiconductor memory device including a vertical channel film and having improved element performance and integration degree, and/or a method of fabricating the same.

2. Description of the Related Art

In order to satisfy excellent performance and low price desired by consumers, an integration degree of a semiconductor device may be increased. In the case of the semiconductor device, since the integration degree is an important factor that determines price of a product, the increased integration degree may be particularly required. In the case of a two-dimensional or planar semiconductor device, since the integration degree may be mainly determined by an area occupied by unit memory cells, the integration degree may be greatly affected by the level of fine pattern forming technology.

However, because ultra-high-priced apparatuses may be required for miniaturization of the pattern, although the integration degree of the two-dimensional semiconductor device is increasing, it is still limited. Three-dimensional semiconductor memory devices including memory cells arranged three-dimensionally have been proposed accordingly.

SUMMARY

Aspects of inventive concepts relate to a semiconductor memory device including a vertical structure having improved element performance and reliability.

Aspects of inventive concepts also relate to a method of fabricating a semiconductor memory device including a vertical structure having improved element performance and reliability.

According to an embodiment, a semiconductor memory device may include a substrate; a stacked structure on the substrate, the stacked structure including a plurality of conductive lines stacked on the substrate; and a vertical structure penetrating the stacked structure. The vertical structure may include a vertical insulating pattern and a channel film extending along sidewalls of the vertical insulating pattern. The vertical insulating pattern may include an inner region and an outer region. The outer region of the vertical insulating pattern may be between the channel film and the inner region of the vertical insulating pattern, and the outer region of the vertical insulating pattern may include a diffused metal.

According to an embodiment, a semiconductor memory device may include a substrate; a stacked structure on the substrate, the stacked structure including a plurality of conductive lines stacked on a substrate; and a vertical structure penetrating the stacked structure. The vertical structure may include a vertical insulating pattern and a channel film extending along sidewalls of the vertical insulating pattern. The vertical insulating pattern may include a diffused metal, and the channel film may include a metal silicide including the diffused metal.

According to an embodiment, a semiconductor memory device may include a substrate; a peripheral logic structure on the substrate and including a peripheral circuit; a horizontal conductive substrate extending along an upper surface of the peripheral logic structure; a stacked structure on the horizontal conductive substrate, the stacked structure including a plurality of conductive lines stacked on the horizontal conductive substrate; and a vertical structure penetrating the stacked structure. The vertical structure may include a memory cell insulating film, a vertical insulating pattern, and a channel film between the memory cell insulating film and the vertical insulating pattern. The vertical insulating pattern may include an inner region and an outer region. The outer region of the vertical insulating pattern may be between the channel film and the inner region of the vertical insulating pattern. The outer region of the vertical insulating pattern may include a diffused metal and the channel film include the diffused metal.

However, aspects of inventive concepts are not restricted to those discussed above. The above and other aspects of inventive concepts will become more apparent to one of ordinary skill in the art to which embodiments of inventive concept pertain by the detailed description below.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

Figure 1:
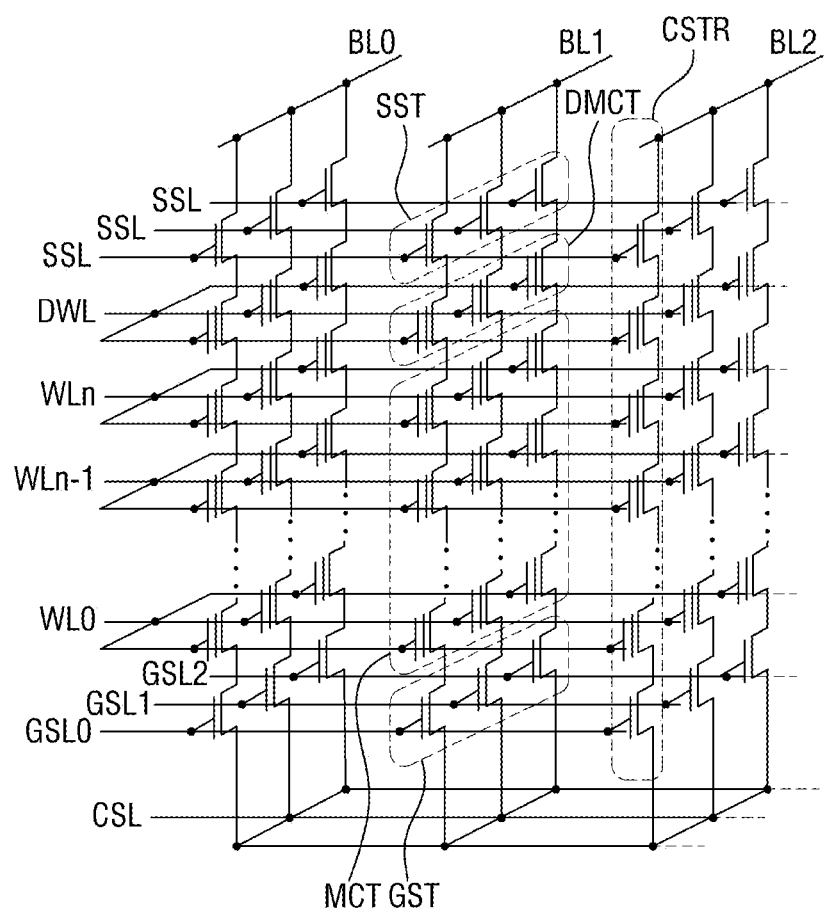
FIG. 1 is an example circuit diagram for explaining a semiconductor memory device according to some embodiments.

FIG. 1 is an example circuit diagram for explaining a semiconductor memory device according to some embodiments.

Referring to FIG. 1, a memory cell array of the semiconductor memory device according to some embodiments may include a common source line CSL, a plurality of bit lines BL0 to BL2, and a plurality of cell strings CSTR placed between the common source line CSL and the plurality of bit lines BL0 to BL2.

The plurality of cell strings CSTR may be connected in parallel to each of the bit lines BL0 to BL2. The plurality of cell strings CSTR may be commonly connected to the common source line CSL. That is, the plurality of cell strings CSTR may be placed between the plurality of bit lines BL0 to BL2 and one common source line CSL. A plurality of common source lines CSL may be arranged two-dimensionally. Here, the same voltage may be electrically applied to the common source line CSL, or each of the common source lines CSL may be electrically controlled.

For example, each cell string CSTR may include a string selection transistor SST, serially connected memory cells MCT, and a ground selection transistor GST. Further, each of the memory cells MCT includes a data storage element.

As an example, each cell string CSTR may include a string selection transistor SST connected in series with the bit lines BL0 to BL2. The ground selection transistor GST may be connected to the common source line CSL. The memory cells MCT may be connected in series between the string selection transistor SST and the ground selection transistor GST.

Furthermore, each cell string CSTR may further include a dummy cell DMCT connected between the string selection transistor SST and the memory cell MCT.

Although not shown in the drawing, the dummy cell DMCT may also be connected between the ground selection transistor GST and the memory cell MCT. As another example, the ground selection transistor GST in each cell string CSTR may be formed of a plurality of serially connected MOS transistors. As another example, each cell string CSTR may include a plurality of serially connected string selection transistors. As still another example, each cell string CSTR may further include an erase control transistor placed between the bit lines BL0 to BL2 and the string selection transistor SST. The erase control transistor may be connected in series with the string selection transistor SST.

According to some embodiments, the string selection transistor SST may be controlled by the string selection line SSL. The memory cells MCT may be controlled by a plurality of word lines WL0 to WLn, and the dummy cells DMCT may be controlled by a dummy word line DWL. Also, the ground selection transistor GST may be controlled by the ground selection line GSL. The common source line CSL may be commonly connected to the sources of the ground selection transistor GST.

One cell string CSTR may include a plurality of memory cells MCT having different distances from the common source line CSL. Further, a plurality of word lines WL0 to WLn, and DWL may be placed between the common source line CSL and the bit lines BL0 to BL2.

The gate electrodes of the memory cells MCT, which are placed at substantially the same distance from the common source line CSL, are commonly connected to one of the word lines WL0 to WLn, and DWL and may be in an equipotential state. Unlike this, even if the gate electrodes of the memory cells MCT are placed at substantially the same level from the common source lines CSL, the gate electrodes placed in different rows or columns may be controlled independently.

The ground selection lines GSL0 to GSL2 and the string selection lines SSL may extend, for example, in the same direction as the word lines WL0 to WLn, and DWL. The ground selection lines GSL0 to GSL2 and the string selection lines SSL, which are placed at substantially the same level from the common source line CSL, may be electrically separated from each other.

Although not shown in the drawing, when the cell string CSTR includes the erase control transistors, the erase control transistors may be controlled by a common erase control line. The erase control transistors cause a gate induced drain leakage (GIDL) at the time of the erase operation of the memory cell array. That is, the erase control transistors may be GIDL transistors.

Figure 2:
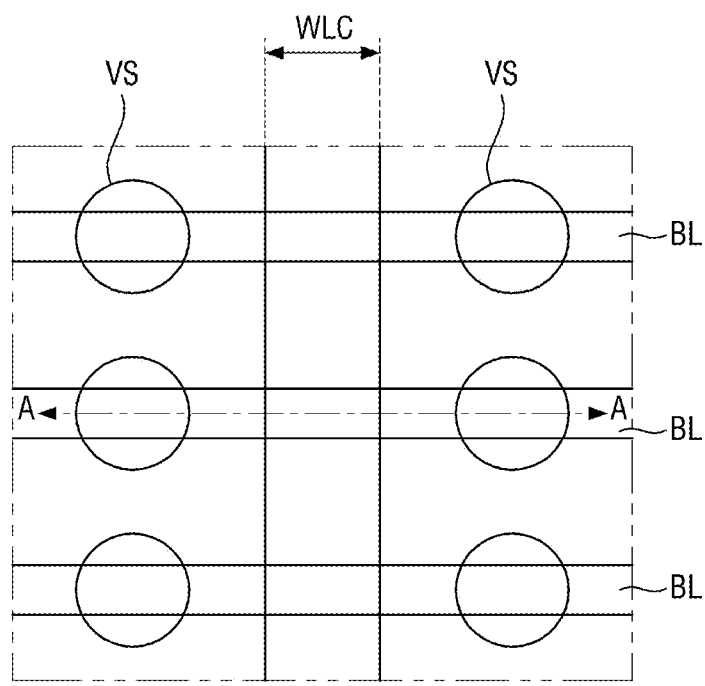
FIG. 2 is a schematic layout view for explaining the semiconductor memory device according to some embodiments.
Figure 2:
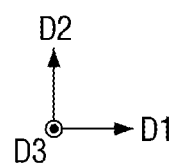
Figure 3:
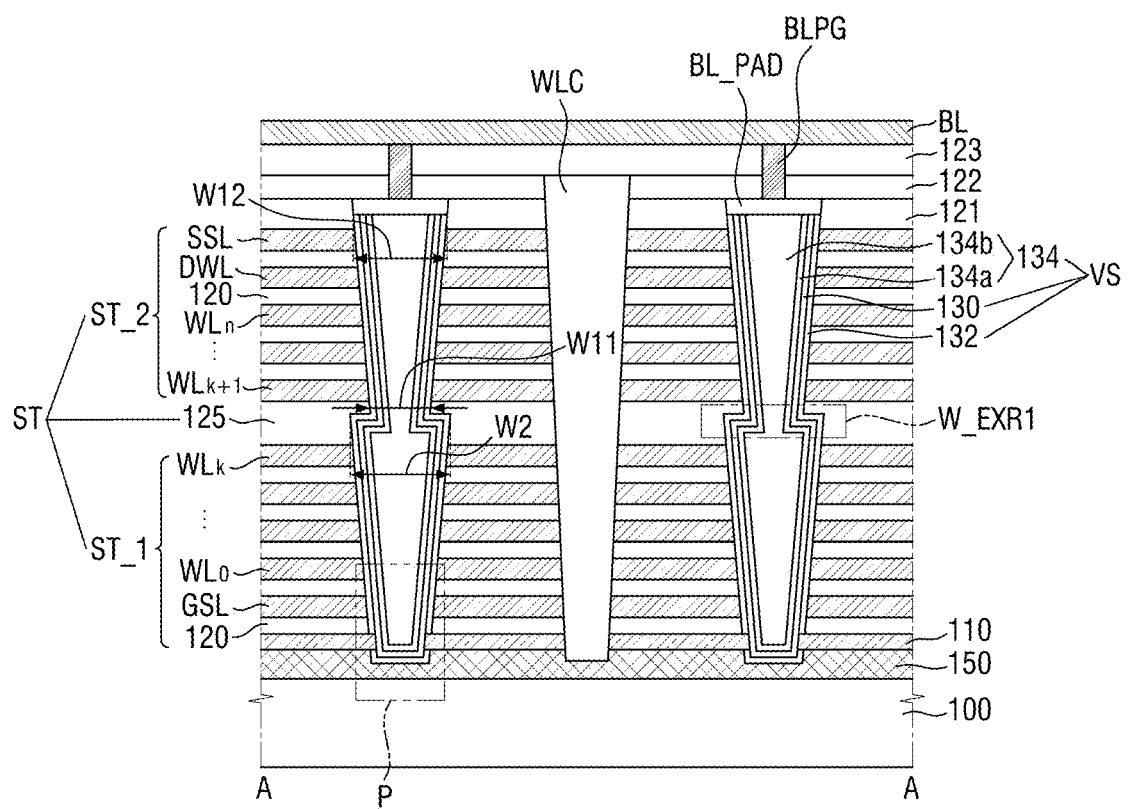
FIG. 3 is a cross-sectional view taken along a line A-A of FIG. 2.
Figure 3:
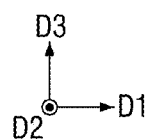
Figure 4A:
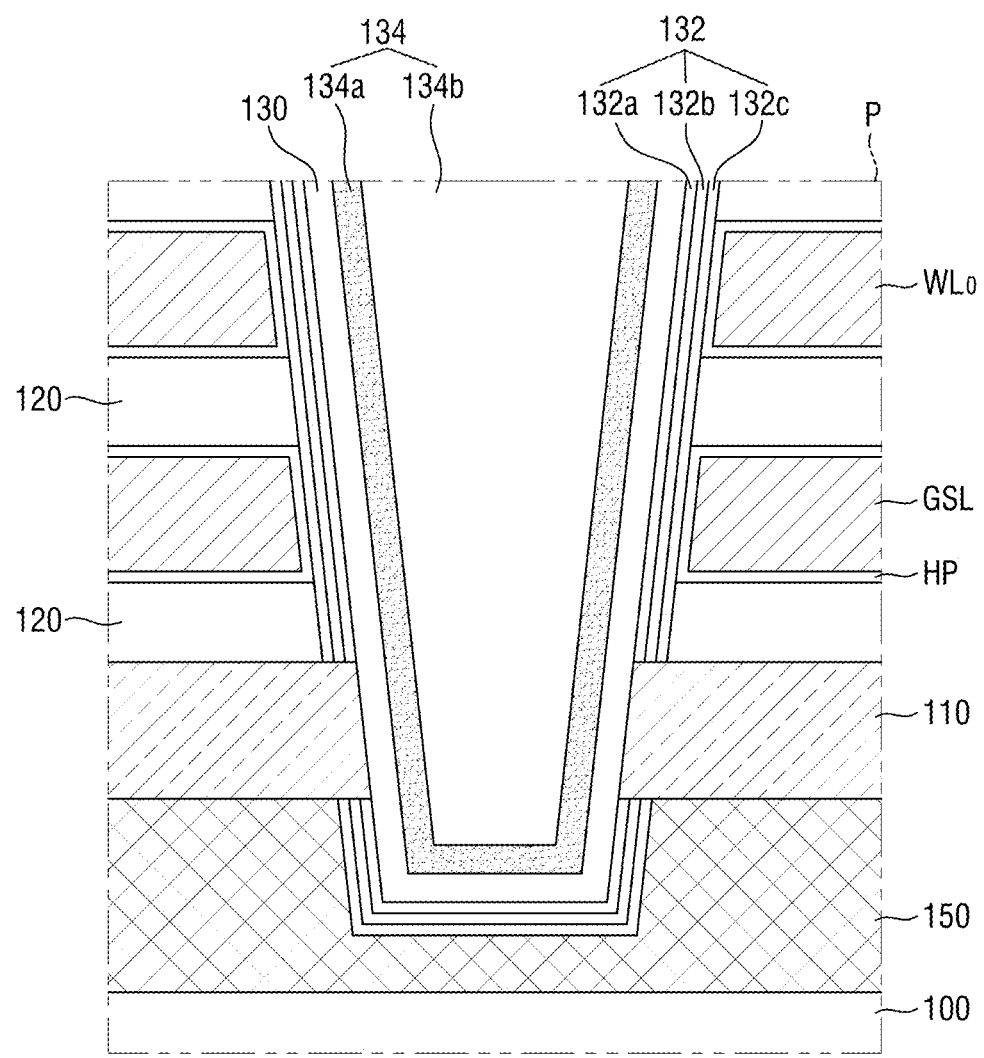
FIGS. 4*a* and 4*b* are various diagrams for explaining a region P of FIG. 3.
Figure 4B:
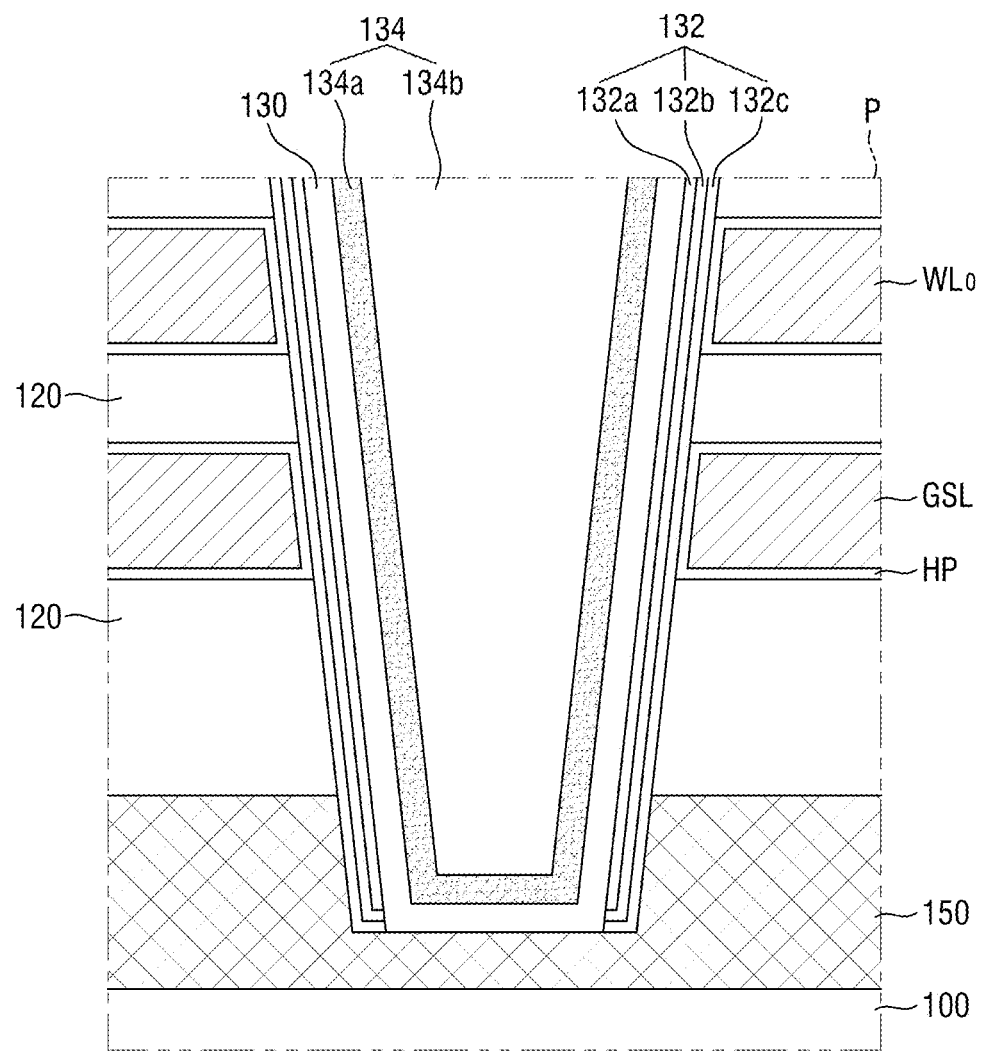

FIG. 2 is a schematic layout view for explaining a semiconductor memory device according to some embodiments. FIG. 3 is a cross-sectional view taken along a line A-A of FIG. 2. FIGS. 4a and 4b are various diagrams for explaining a region P of FIG. 3.

Referring to FIGS. 2 to 4b, the semiconductor memory device according to some embodiments may include a substrate 100, a stacked structure ST, a plurality of vertical structures VS, and a plurality of bit lines BL.

The substrate 100 may include one of a silicon substrate, a silicon germanium substrate, a germanium substrate, an SGOI (silicon germanium on insulator), an SOI (silicon-on-insulator), and a GOI (Germanium-On-Insulator). Or, the substrate 100 may include, but is not limited to, a semiconductor material such as indium antimonide, lead tellurium compound, indium arsenide, indium phosphide, gallium arsenide or gallium antimonide.

A horizontal conductive substrate 150 may be placed on the substrate 100. The horizontal conductive substrate 150 may be a common source plate. That is, the horizontal conductive substrate 150 may serve as the common source line CSL of FIG. 1.

The horizontal conductive substrate 150 may include at least one of a conductive semiconductor film, a metal silicide film, and a metal film. When the horizontal conductive substrate 150 includes a conductive semiconductor film, the horizontal conductive substrate 150 may include, for example, at least one of silicon (Si), germanium (Ge), silicon germanium (SiGe), gallium arsenide (GaAs), indium gallium arsenic (InGaAs), aluminum gallium arsenide (AlGaAs), or combinations thereof. The horizontal conductive substrate 150 may have a crystal structure including at least one selected from single crystal, amorphous, and polycrystal. The horizontal conductive substrate 150 may include at least one of p-type impurities, n-type impurities, and carbon contained in the semiconductor film.

The stacked structure ST may be placed on the horizontal conductive substrate 150. The stacked structure ST may include a plurality of conductive lines GSL, $WL_0$ to $WL_n$, DWL, and SSL, and a plurality of inter-electrode insulating films 120 and 125 which are stacked in a third direction D3. The inter-electrode insulating films 120 and 125 are placed between the conductive lines GSL, $WL_0$ to $WL_n$, DWL, and SSL spaced apart from each other in the third direction D3.

The plurality of conductive lines GSL, $WL_0$ to $WL_n$, DWL, and SSL may include a ground selection lines GSL, a plurality of word lines $WL_0$ to $WL_n$, a dummy word line DWL, and a string selection line SSL. The ground selection line GSL, the plurality of word lines $WL_0$ to $WL_n$, the dummy word line DWL, and the string selection line SSL may be sequentially stacked on the substrate 100.

Although only seven word lines $WL_0$ to $WL_n$ are shown on the ground selection line GSL in FIG. 3, this is only for convenience of explanation, and the embodiment is not limited thereto.

Further, although the conductive line placed at the uppermost part of the stacked structure BST is shown as the dummy word line DWL, the embodiment is not limited thereto. When the cell string CSTR of FIG. 1 does not include the dummy cell DMCT, the conductive line placed at the uppermost part of the stacked structure ST may, of course, be a word line $WL_n$.

The stacked structure ST may include a first sub-stacked structure ST_1, and a second sub-stacked structure ST_2 on the first sub-stacked structure ST_1. The first sub-stacked structure ST_1 may include a ground selection line GSL and some word lines $WL_0$ to $WL_k$. The second sub-stacked structure ST_2 may include remaining word lines $WL_{k+1}$ to $WL_n$, the dummy word line DWL, and the string selection line SSL. Here, n is a natural number larger than k.

The inter-electrode insulating film 125 between the word line $WL_k$ located at the uppermost part of the first sub-stacked structure ST_1 and the word line $WL_{k+1}$ located at the lowermost part of the second sub-stacked structure ST_2 is thicker than the thickness of the inter-electrode insulating film 120 in the first sub-stacked structure ST_1 and the second sub-stacked structure ST_2.

When the cell string CSTR of FIG. 1 includes an erase control line between the string selection line SSL and the bit line BL, the stacked structure ST may of course include additional conductive lines placed on the string selection line SSL.

Although not shown, the plurality of conductive lines GSL, $WL_0$ to $WL_n$, DWL, and SSL stacked in the third direction D3 may be stacked in a staircase shape.

The conductive lines GSL, $WL_0$ to $WL_n$, DWL, and SSL may include, for example, a conductive material. The conductive lines GSL, $WL_0$ to $WL_n$, DWL, and SSL may include, for example, a metallic material. In the semiconductor memory device according to some embodiments, the conductive lines GSL, $WL_0$ to $WL_n$, DWL, and SSL may include the same material, and may have the same conductive film stacked structure. The conductive lines GSL, $WL_0$ to $WL_n$, DWL, and SSL may be formed at the same level. Here, the "same level" means that the conductive lines are formed by the same fabricating process.

Although the conductive lines GSL, $WL_0$ to $WL_n$, DWL, and SSL may include metals such as tungsten (W), cobalt (Co), nickel (Ni), and the like, the kind of metal is not limited thereto. In FIG. 3, although the conductive lines GSL, $WL_0$ to $WL_n$, DWL, and SSL are shown as being formed of a single film, this is only for convenience of explanation, and embodiments are not limited thereto. The conductive lines GSL, $WL_0$ to $WL_n$, DWL, and SSL may further include a barrier conductive film. The barrier conductive film may include at least one of a metal, a metal nitride, a metal carbonitride, and a two-dimensional (2D) material. For example, the two-dimensional material may be a metallic material and/or a semiconducting material. The 2D material may include a 2D allotrope or a 2D compound.

The inter-electrode insulating films 120 and 125 may include, for example, but are not limited to, silicon oxide.

A cut line WLC may be placed in the stacked structure ST. The cut line WLC may penetrate the stacked structure ST.

The cut line WLC may extend in the second direction D2 to cut the stacked structure ST. The cut line WLC may cut the conductive lines GSL, $WL_0$ to $WL_n$, DWL, and SSL. The adjacent cut lines WLC may be spaced apart from each other in the first direction D1.

The cut line WLC may include, for example, at least one of silicon oxide, silicon nitride, silicon oxynitride, and a low-dielectric constant material. The low-dielectric constant material may include, for example, but is not limited to, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

In the semiconductor memory device according to some embodiments, the cut line WLC may not include a conductive material. That is, the cut line WLC may be made of only an insulating material. In some embodiments, instead of the cut line WLC being formed of a single film, the cut line WLC may include a plurality of films.

A vertical structure VS extends in the third direction D3. The vertical structure VS may penetrate the stacked structure ST. The vertical structure VS may include conductive lines GSL, $WL_0$ to $WL_n$, DWL, and SSL.

A bit line pad BL_PAD is placed on the vertical structure VS. The bit line pad BL_PAD may include a conductive material. For example, the bit line pad BL_PAD may include a semiconductor material doped with n-type impurities.

In the semiconductor memory device according to some embodiments, the vertical structure VS may have a first width extension region W_EXR1 in which a width in a first direction D1 increases as it goes away from the bit line pad BL_PAD.

The first width extension region W_EXR1 may be defined in the stacked structure ST. The first width extension region W_EXR1 may be defined between the first sub-stacked structure ST_1 and the second sub-stacked structure ST_2.

As it goes away from the bit line pad BL_PAD, a width of the vertical structure VS in the second sub-stacked structure ST_2 in the first direction D1 decreases from W12 to W11. In the first width extension region W_EXR1, the width of the vertical structure VS in the first direction D1 increases from W11 to W2. Thereafter, as it goes away from the bit line pad BL_PAD, the width of the vertical structure VS in the first sub-stacked structure ST_1 in the first direction D1 may gradually decrease.

Although FIG. 3 shows that the vertical structure VS includes one width extension region W_EXR1, embodiments of inventive concepts are not limited thereto. When the stacked structure ST including the word lines $WL_0$ to $WL_n$ includes three or more sub-stacked structures, the width extension region may increase depending on the number of the sub-stacked structures.

Although FIG. 3 shows that a first center line extending in the third direction D3 of the vertical structure VS placed in the first sub-stacked structure ST_1 coincides with a second center line extending in the third direction D3 of the vertical structure VS placed in the second sub-stacked structure ST_2, this is only for convenience of explanation, and the embodiment is not limited thereto. That is, the first center line may be misaligned from the second center line in the first direction D1 and/or the second direction D2.

The vertical structure VS may include a vertical channel film 130 extending in the third direction D3 and a vertical insulating pattern 134. The vertical structure VS may include a channel insulating film 132 placed between the vertical channel film 130 and the conductive lines GSL, $WL_0$ to $WL_n$, DWL, and SSL. The vertical channel film 130 may be placed between the channel insulating film 132 and the vertical insulating pattern 134.

The vertical channel film 130 may be electrically connected to the horizontal conductive substrate 150 that serves as a common source line. The vertical channel film 130 may be in contact with the bit line pad BL_PAD. The vertical channel film 130 may include sidewall parts extending in the third direction D3, and a bottom part that connects the sidewall parts of the vertical channel film 130. The sidewall parts of the vertical channel film 130 may have a pipe shape having a hollow space inside, for example, a cylindrical shape or a macaroni shape.

The vertical channel film 130 may extend along sidewalls of the conductive lines GSL, $WL_0$ to $WL_n$, DWL, and SSL. In the first width extension region W_EXR1, the vertical channel film 130 extending in the third direction D3 may be bent in a direction (e.g., the first direction D1) away from the first center line of the vertical structure VS in the second sub-stacked structure ST_2.

The vertical channel film 130 may include a semiconductor material, for example, such as silicon (Si), germanium (Ge), or a mixture thereof. In the semiconductor memory device according to some embodiments, the vertical channel film 130 may include a polycrystalline semiconductor material. For example, the vertical channel film 130 may include polysilicon.

The vertical insulating pattern 134 may fill the space defined by the vertical channel film 130. The vertical channel film 130 may extend along sidewalls of the vertical insulating pattern 134. The vertical insulating pattern 134 may be in contact with the vertical channel film 130. The vertical channel film 130 may be placed between the bottom surface of the vertical insulating pattern 134 and the channel insulating film 132.

The vertical insulating pattern 134 may include an inner region 134b and an outer region 134a. The outer region 134a of the vertical insulating pattern may be formed along a profile of the vertical channel film 130. Sidewalls of the inner region 134b of the vertical insulating pattern may be covered with the outer region 134a of the vertical insulating pattern. The outer region 134a of the vertical insulating pattern may be placed between the vertical channel film 130 and the inner region 134b of the vertical insulating pattern. The outer region 134a of the vertical insulating pattern may be in contact with the vertical channel film 130.

The outer region 134a of the vertical insulating pattern may be a filter film. The inner region 134b of the vertical insulating pattern may be a core pattern. The outer region 134a of the vertical insulating pattern may include an insulating material, and may include, for example, at least one of silicon oxide, silicon oxynitride, silicon nitride, and a high-dielectric constant metal oxide. The inner region 134b of the vertical insulating pattern may include an insulating material, and may include, for example, at least one of silicon oxide, silicon oxynitride, and a low-dielectric constant material. For example, the high-dielectric constant metal oxide may include, but is not limited to, at least one of hafnium oxide, hafnium silicon oxide, hafnium aluminum oxide, and aluminum oxide.

In the semiconductor memory device according to some embodiments, a boundary between the filter film of the vertical insulating pattern 134 and the core pattern of the vertical insulating pattern 134 may be divided. As an example, the outer region 134a of the vertical insulating pattern may include a material different from the inner region 134b of the vertical insulating pattern. For example, the inner region 134b of the vertical insulating pattern includes silicon oxide, and the outer region 134a of the vertical insulating pattern may include at least one of silicon oxynitride, silicon nitride, and a high-dielectric constant metal oxide.

As another example, the outer region 134a of the vertical insulating pattern and the inner region 134b of the vertical insulating pattern may include the same material. Also in this case, the boundary between the outer region 134a of the vertical insulating pattern and the inner region 134b of the vertical insulating pattern may be divided.

The vertical insulating pattern 134 may include a diffused metal. The diffused metal may be a metal contained in a metal injection film (140 of FIG. 16) deposited during the fabricating process for the metal-induced crystallization process.

The outer region 134a of the vertical insulating pattern may include a diffused metal. The concentration of the diffusion metal included in the vertical insulating pattern may be less than 1%. As an example, since the diffused metal is diffused into the outer region 134a of the vertical insulating pattern through the metal-induced crystallization process, the outer region 134a of the vertical insulating pattern may include a matrix deformation pattern due to the diffused metal. As another example, the outer region 134a of the vertical insulating pattern may not include a matrix deformation pattern due to the diffused metal.

As an example, the inner region 134b of the vertical insulating pattern may include no diffused metal. In the fabricating process, the inner region 134b of the vertical insulating pattern may be deposited after the metal-induced crystallization process is performed. Accordingly, the inner region 134b of the vertical insulating pattern may not include the diffused metal included in the outer region 134a of the vertical insulating pattern.

As another example, the inner region 134b of the vertical insulating pattern may include a diffused metal. The inner region 134b of the vertical insulating pattern is deposited after the metal-induced crystallization process is performed. However, thereafter, during progress of the fabricating process, a part of the diffused metal included in the outer region 134a of the vertical insulating pattern may be diffused into a part of the inner region 134b of the vertical insulating pattern. Since the diffused metal in the inner region 134b of the vertical insulating pattern enters the inner region 134b of the vertical insulating pattern by diffusion, as it goes away from the boundary between the outer region 134a of the vertical insulating pattern and the inner region 134b of the vertical insulating pattern, concentration ($/cm^3$) of the diffused metal included in the inner region 134b of the vertical insulating pattern decreases.

The diffused metal may include, for example, at least one of gold (Au), aluminum (Al), copper (Cu), silver (Ag), palladium (Pd), nickel (Ni), platinum (Pt), manganese (Mn), rhodium (Rh), cobalt (Co), iron (Fe), chromium (Cr), titanium (Ti), niobium (Nb), iridium (Ir), tantalum (Ta), rhenium (Re), molybdenum (Mo), vanadium (V), hafnium (Hf), ruthenium (Ru), zirconium (Zr), tin (Sn), antimony (Sb), and tungsten (W). The diffused metal may serve to lower the crystallization temperature of the vertical channel film 130.

The vertical channel film 130 includes a diffused metal included in the vertical insulating pattern 134. The diffused metal included in the vertical channel film 130 may penetrate the outer region 134a of the vertical insulating pattern through the metal-induced crystallization process and may be diffused into the vertical channel film 130.

As an example, the vertical channel film 130 may include metal silicide including a diffused metal. During the metal-induced crystallization process, the diffused metal may react with silicon to form a metal silicide. As another example, the vertical channel film 130 may not include a metal silicide. The diffused metal in which silicidization reaction does not easily occur assists in the crystallization of the vertical channel film 130, but may not form the metal silicide.

After the metal-induced crystallization process is performed, the outer region 134a of the vertical insulating pattern, which is the filter film, is not removed. When the outer region 134a of the vertical insulating pattern, which is the filter film, is removed, a defect may be induced in the vertical channel film 130 and/or the channel insulating film 132 while removing the filter film. Defects induced in the vertical channel film 130 and/or the channel insulating film 132 may degrade the reliability of the semiconductor memory device.

In FIGS. 4a and 4b, the channel insulating film 132 may include, for example, a tunnel insulating film 132a, a charge storage film 132b and a blocking insulating film 132c sequentially placed on the vertical channel film 130. The tunnel insulating film 132a, the charge storage film 132b and the blocking insulating film 132c are merely examples, and inventive concepts are not limited thereto. The channel insulating film 132 may be a memory cell insulating film.

The tunnel insulating film 132a may include, for example, silicon oxide or a high-dielectric constant material (e.g., aluminum oxide ($Al_2O_3$) or hafnium oxide ($HfO_2$)). The charge storage film 132b may include, for example, silicon nitride. The blocking insulating film 132c may include, for example, silicon oxide or a high-dielectric constant material (e.g., aluminum oxide ($Al_2O_3$) or hafnium oxide ($HfO_2$)). In the semiconductor memory device according to some embodiments, the tunnel insulating film 132a and the blocking insulating film 132c may include silicon oxide.

A horizontal insulating pattern HP may be placed between the conductive lines GSL, $WL_0$ to $WL_n$, DWL, and SSL and the channel insulating film 132. The horizontal insulating pattern HP may include, for example, silicon oxide or a high-dielectric constant material (e.g., aluminum oxide ($Al_2O_3$) or hafnium oxide ($HfO_2$)). Unlike the shown case, the horizontal insulating pattern HP may not be placed between the conductive lines GSL, $WL_0$ to $WL_n$, DWL, and SSL and the channel insulating film 132.

In FIG. 4a, the tunnel insulating film 132a, the charge storage film 132b and the blocking insulating film 132c may be separated from the lower part of the vertical channel film 130. The separated tunnel insulating film 132a, charge storage film 132b and blocking insulating film 132c may expose a part of the vertical channel film 130. A vertical structure support film 110 may be placed between the separated tunnel insulating film 132a, charge storage film 132b and blocking insulating film 132c. The vertical structure support film 110 may electrically connect the horizontal conductive substrate 150 and the vertical channel film 130. The vertical structure support film 110 may include, for example, a semiconductor material such as silicon (Si), germanium (Ge), or a mixture thereof.

In FIG. 4b, the vertical structure support film 110 may not be placed between the horizontal conductive substrate 150 and the stacked structure ST. In such a case, the sidewall parts of the vertical channel film 130 are not exposed, and the bottom part of the vertical channel film 130 may be exposed. The tunnel insulating film 132a, the charge storage film 132b and the blocking insulating film 132c between the bottom part of the vertical channel film 130 and the horizontal conductive substrate 150 may be removed. The vertical channel film 130 may be electrically connected to the horizontal conductive substrate 150 through the bottom part of the vertical channel film 130. Although not shown, an epitaxial semiconductor pattern may be placed between the vertical channel film 130 and the substrate 100.

First to third interlayer insulating films 121, 122, and 123 may be sequentially placed on the stacked structure ST. A bit line pad BL_PAD may be placed in the first interlayer insulating film 121. The cut line WLC may penetrate the first interlayer insulating film 121 and the second interlayer insulating film 122. The first to third interlayer insulating films 121, 122, and 123 may each include, for example, but are not limited to, at least one of silicon oxide, silicon oxynitride, and a low-dielectric constant material.

The bit line BL may be placed on the upper stacked structure ST. The bit line BL may extend in the first direction D1. The bit line BL may be electrically connected to at least one of the vertical channel films 130. The bit line BL may be formed on the third interlayer insulating film 123. The bit line BL may be electrically connected to the bit line pad BL_PAD via the bit line plug BLPG. The bit line BL and the bit line plug BLPG each include a conductive material.

Figure 5:
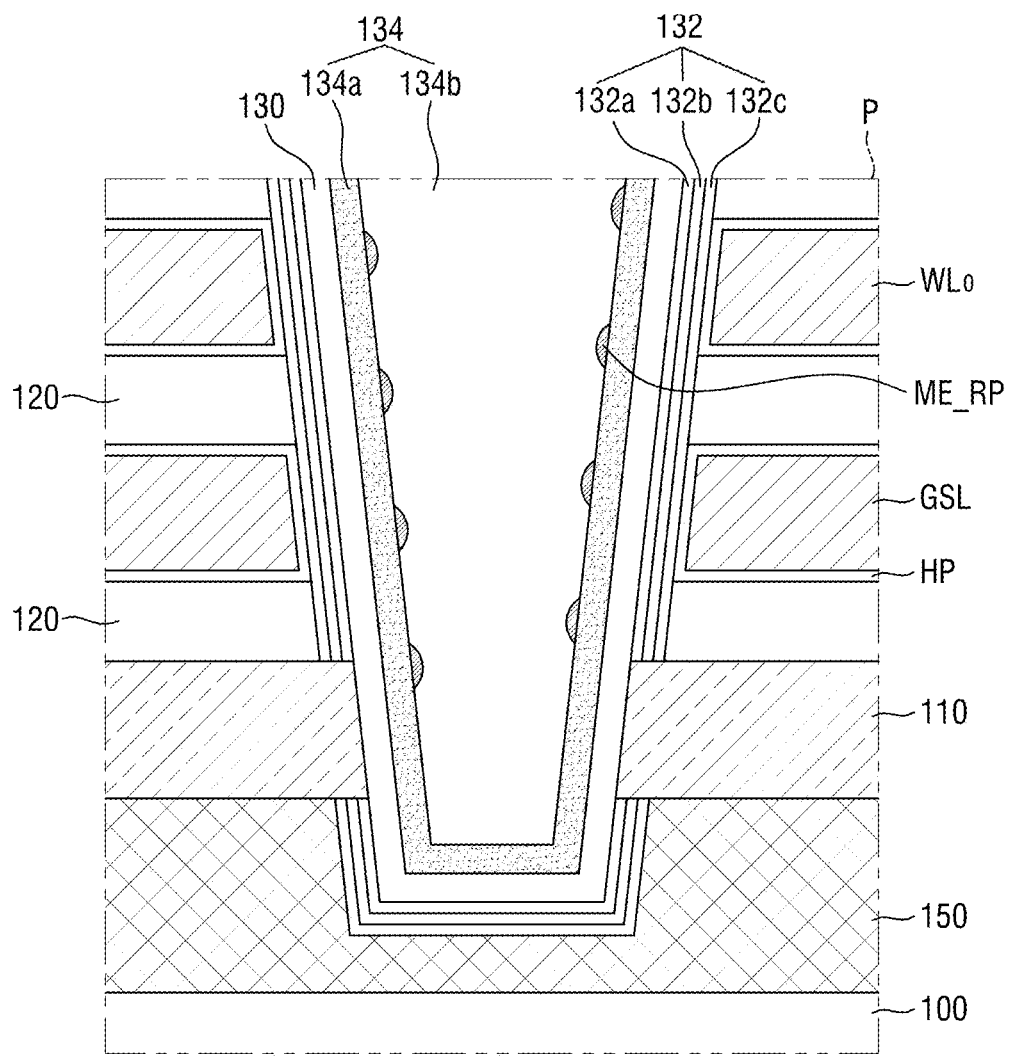
FIG. 5 is a diagram for explaining the semiconductor memory device according to some embodiments.
Figure 6:
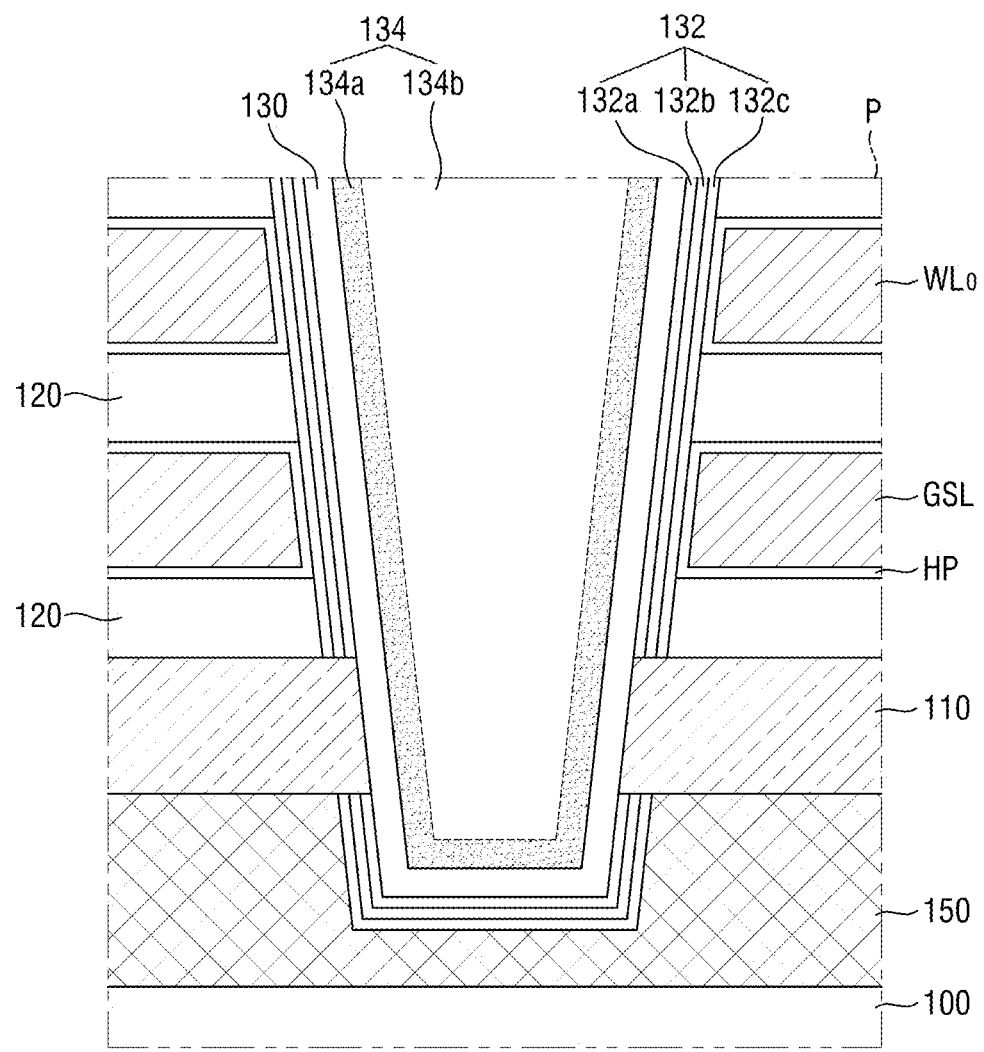
FIG. 6 is a diagram for explaining the semiconductor memory device according to some embodiments.

FIG. 5 is a diagram for explaining a semiconductor memory device according to some embodiments. FIG. 6 is a diagram for explaining the semiconductor memory device according to some embodiments. For convenience of explanation, different points from those explained using FIGS. 2 to 4b will be mainly explained. For reference, FIGS. 5 and 6 are diagrams showing a region P of FIG. 3, respectively.

Referring to FIG. 5, the semiconductor memory device according to some embodiments may further include metal particles ME_RP placed in the vertical insulating pattern 134.

The vertical structure VS may include metal particles ME_RP. The metal particles ME_RP may be placed at the boundary between the outer region 134a of the vertical insulating pattern and the inner region 134b of the vertical insulating pattern.

The metal particles ME_RP may include the diffused metal included in the vertical channel film 130 and the outer region 134a of the vertical insulating pattern. The metal particles ME_RP may be generated by remaining parts of the deposited metal injection film (140 of FIG. 16) during the fabricating process for the metal-induced crystallization process.

Referring to FIG. 6, in the semiconductor memory device according to some embodiments, the vertical insulating pattern 134 may be formed of a single film.

The inner region 134b of the vertical insulating pattern and the outer region 134a of the vertical insulating pattern may include the same material. Also, a boundary between the inner region 134b of the vertical insulating pattern and the outer region 134a of the vertical insulating pattern may not be divided. The inner region 134b of the vertical insulating pattern and the outer region 134a of the vertical insulating pattern may include, for example, silicon oxide.

As a result, although the outer region 134a of the vertical insulating pattern is formed in a fabricating process different from the inner region 134b of the vertical insulating pattern, the vertical insulating pattern 134 may appear as if it is formed by a single film.

The outer region 134a of the vertical insulating pattern may include a diffused metal.

Figure 7:
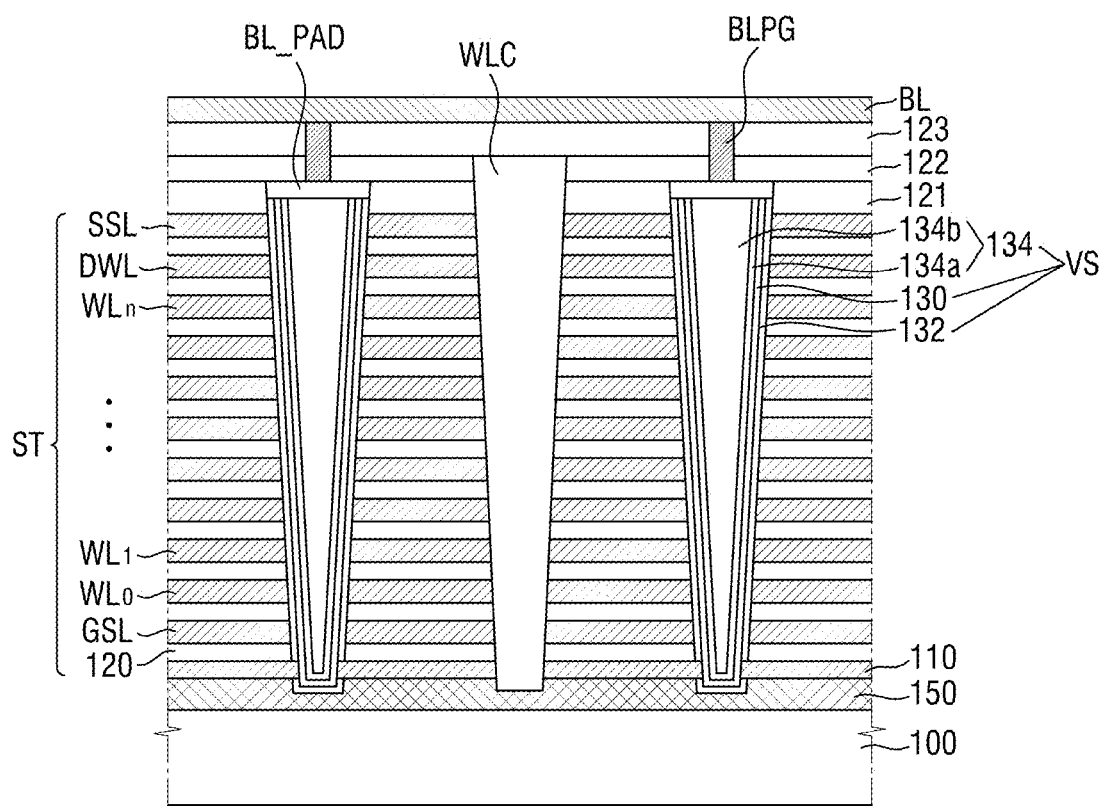
FIG. 7 is a diagram for explaining the semiconductor memory device according to some embodiments.
Figure 8:
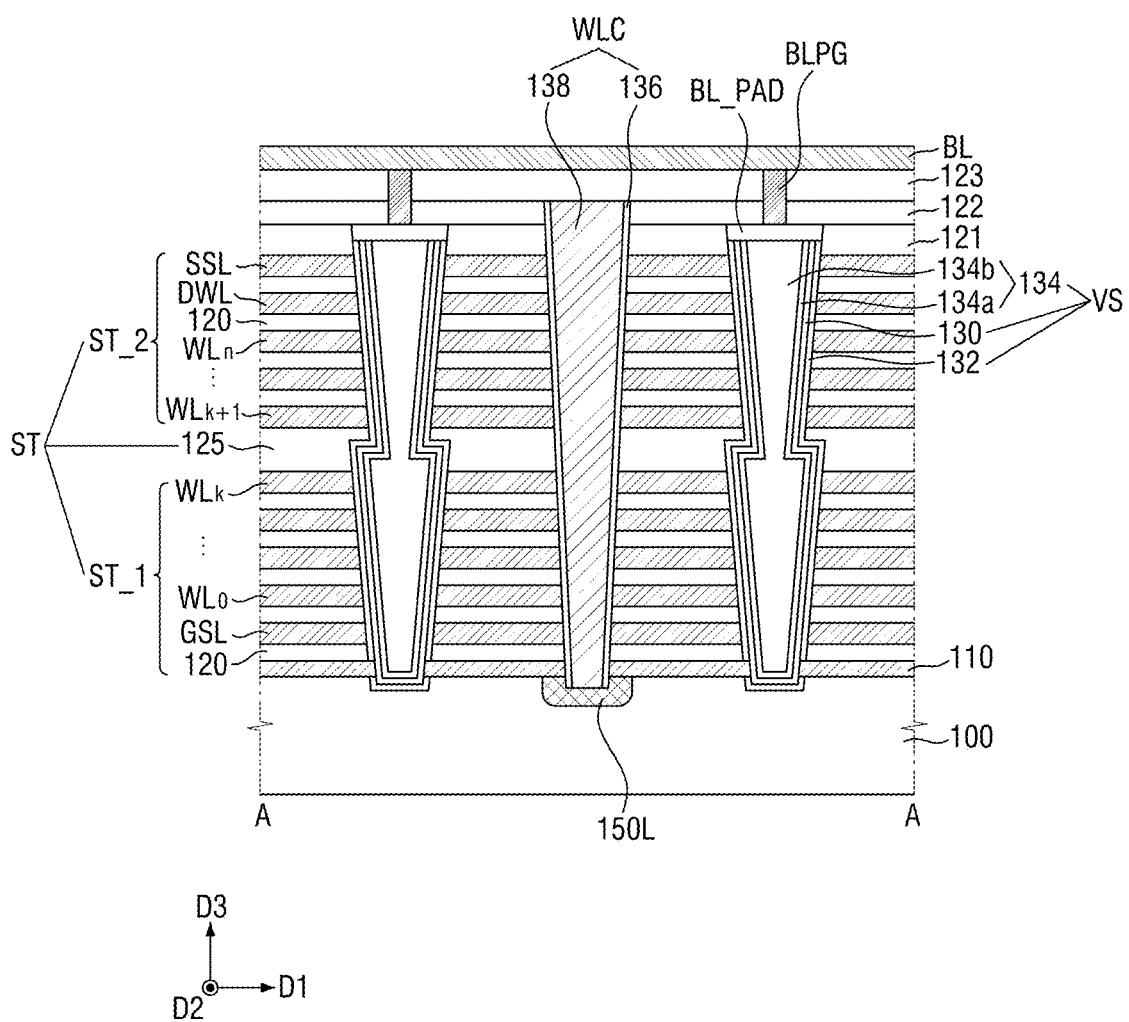
FIG. 8 is a diagram for explaining the semiconductor memory device according to some embodiments.

FIG. 7 is a diagram for explaining a semiconductor memory device according to some embodiments. FIG. 8 is a diagram for explaining the semiconductor memory device according to some embodiments. For convenience of explanation, points different from those explained using FIGS. 2 to 4b will be mainly explained.

Referring to FIG. 7, in the semiconductor memory device according to some embodiments, a vertical structure VS may not include a width extension region in which a width extends in the first direction D1 inside the stacked structure ST.

The vertical structure VS may gradually decrease in width in the first direction D1 as it goes away from the bit line pad BL_PAD.

Referring to FIG. 8, in the semiconductor memory device according to some embodiments, the cut line WLC may include a plug pattern 138 and a spacer 136.

The plug pattern 138 may penetrate the stacked structure ST and be connected to the substrate 100. In some embodiments, the plug pattern 138 may be provided in the common source line CSL of the semiconductor memory device of FIG. 1. For example, the plug pattern 138 may include a conductive material. Further, the plug pattern 138 may be connected to the impurity region 150L in the substrate 100. The impurity region 150L may extend, for example, in the second direction Y.

The spacer 136 may be interposed between the plug pattern 138 and the stacked structure ST. For example, the spacer 136 may extend along the side surfaces of the plug pattern 138. The spacer 136 may include an insulating material. Accordingly, the plug pattern 138 may be electrically spaced apart from the conductive lines GSL, $WL_0$ to $WL_n$, DWL, and SSL of the stacked structure ST.

Figure 9:
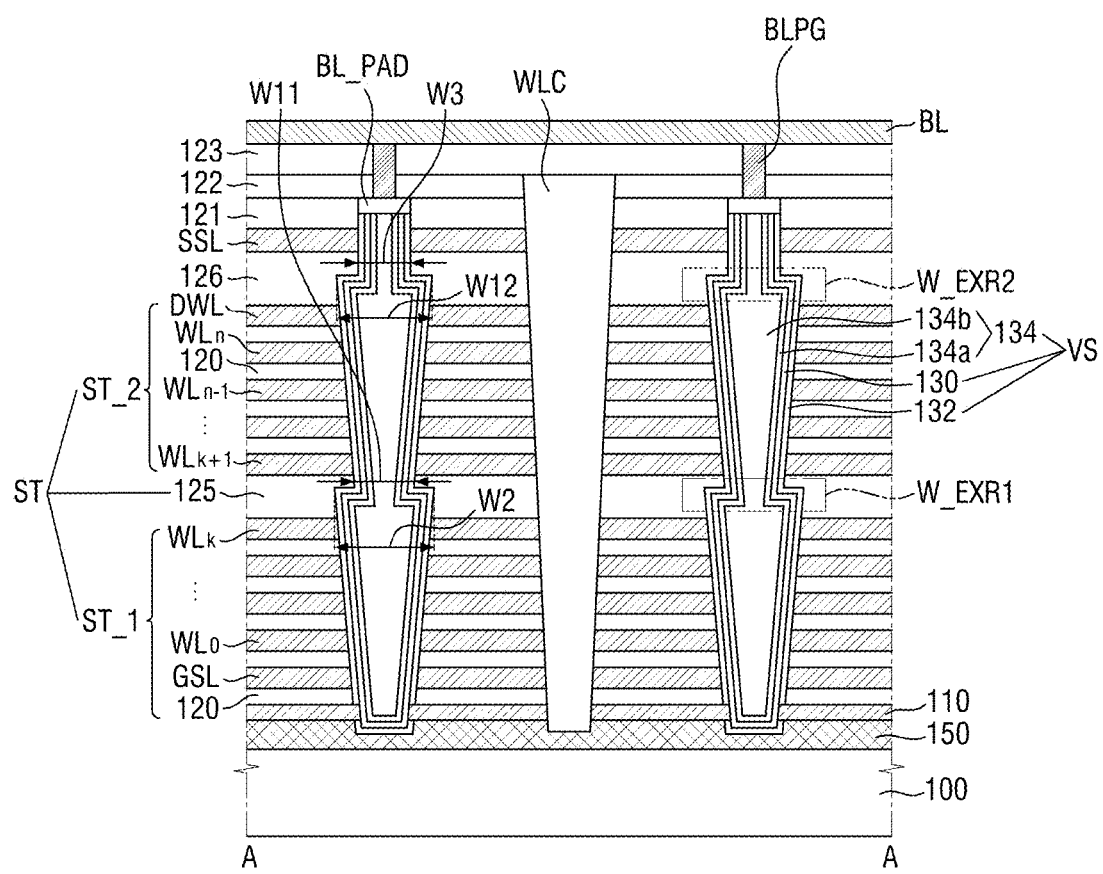
FIG. 9 is a diagram for explaining the semiconductor memory device according to some embodiments.

FIG. 9 is a diagram for explaining a semiconductor memory device according to some embodiments. For convenience of explanation, points different from those explained using FIGS. 2 to 4b will be mainly explained.

Referring to FIG. 9, in the semiconductor memory device according to some embodiments, a vertical structure VS may include a first width extension region W_EXR1 and a second width extension region W_EXR2.

The stacked structure ST may include a plurality of conductive lines GSL, $WL_0$ to $WL_n$, and DWL except the string selection line SSL. The string selection line SSL may be placed on the stacked structure ST.

A thickness of the inter-electrode insulating film 126 between the string selection line SSL and the dummy word line DWL is thicker than a thickness of the inter-electrode insulating film 120 in the first sub-stacked structure ST_1 and the second sub-stacked structure ST_2.

As an example, the plurality of conductive lines GSL, $WL_0$ to $WL_n$, and DWL may include a metallic material. Also, the string selection line SSL may include a metallic material. As another example, the plurality of conductive lines GSL, $WL_0$ to $WL_n$, and DWL may include a metallic material. The string selection line SSL may include a conductive semiconductor material. The string selection line SSL may include, for example, at least one of silicon (Si), germanium (Ge), and silicon germanium (SiGe). Or, the string selection line SSL may include at least one of III-V compound semiconductors. The string selection line SSL may have a crystal structure including at least one selected from single crystal, amorphous and polycrystal. The string selection line SSL may further include at least one of p-type impurities, n-type impurities, and carbon contained in the semiconductor film.

The second width extension region W_EXR2 may be defined between the string selection line SSL and the stacked structure ST. For example, the second width extension region W_EXR2 may be defined between the lower surface of the string selection line SSL and the upper surface of the dummy word line DWL.

As it goes away from the bit line pad BL_PAD, the vertical structure VS may further include the second width extension region W_EXR2 in which a width in the first direction D1 increases. In the second width extension region W_EXR2, the width of the vertical structure VS in the first direction D1 may increase from W3 to W12.

Figure 10:
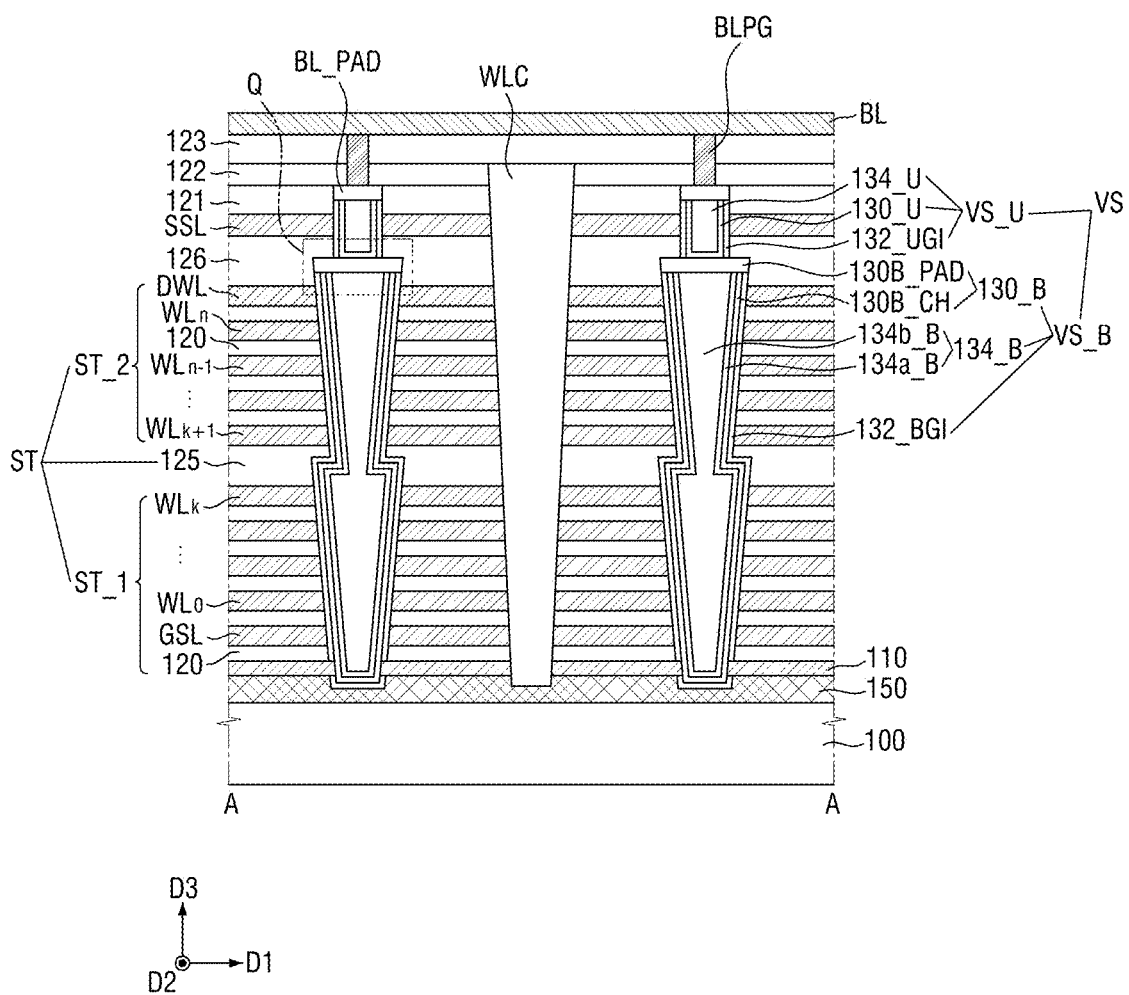
FIG. 10 is a diagram for explaining the semiconductor memory device according to some embodiments.
Figure 11:
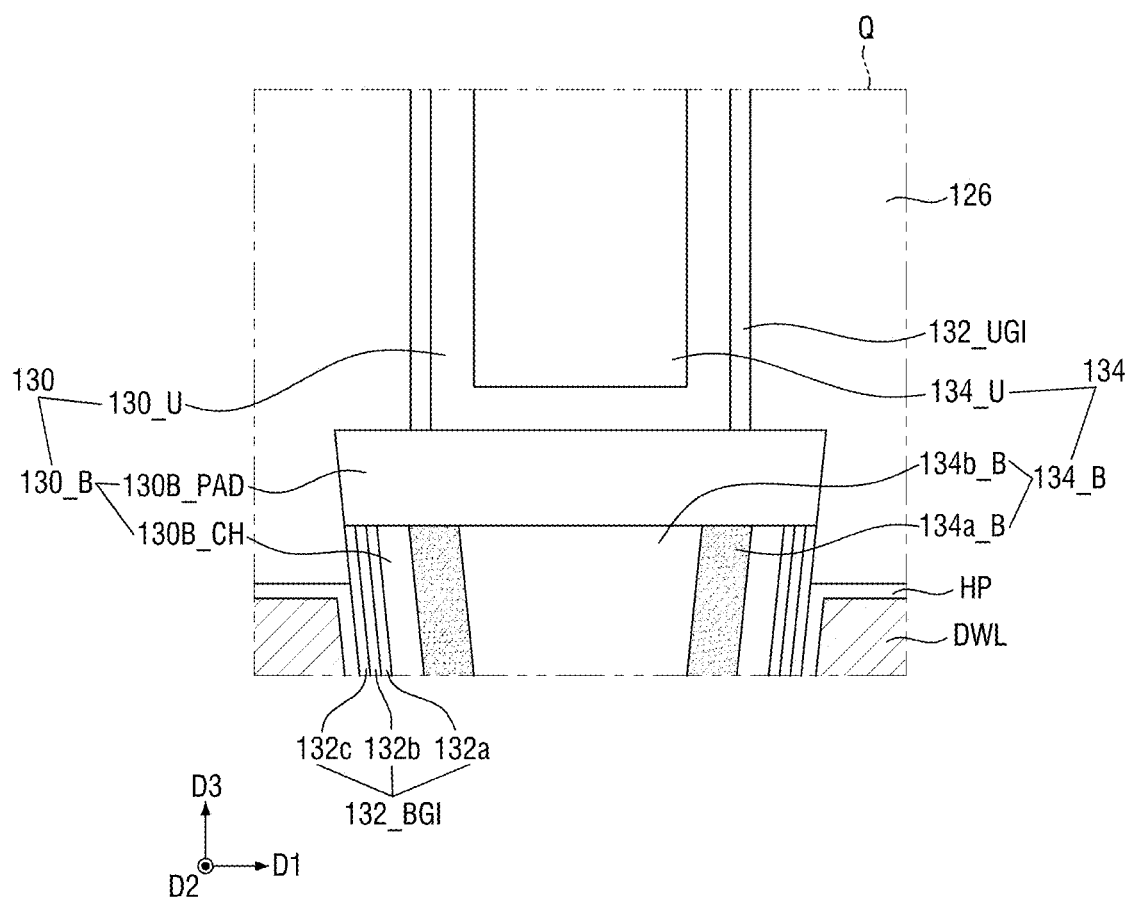
FIG. 11 is a diagram for explaining a region Q of FIG. 10.

FIG. 10 is a diagram for explaining a semiconductor memory device according to some embodiments. FIG. 11 is a diagram for explaining a region Q of FIG. 10. For convenience of explanation, points different from those explained using FIGS. 2 to 4b and 9 will be mainly explained.

Referring to FIGS. 10 and 11, in the semiconductor memory device according to some embodiments, the vertical structure VS may include an upper vertical structure VS_U placed in the string selection line SSL, and a lower vertical structure VS_B placed in the stacked structure ST.

Size of the upper vertical structure VS_U is smaller than size of the lower vertical structure VS_B. That is, the width of the upper vertical structure VS_U in the first direction D1 is smaller than the width of the lower vertical structure VS_B in the first direction D1. The width of the upper vertical structure VS_U in the second direction D2 is smaller than the width of the lower vertical structure VS_B in the second direction D2.

The upper vertical structure VS_U may include an upper vertical channel film 130_U, an upper vertical insulating pattern 134_U, and an upper channel insulating film 132_UGI. The upper channel insulating film 132_UGI may be placed between the string selection line SSL and the upper vertical channel film 130_U. The upper vertical insulating pattern 134_U may fill the space defined by the upper vertical channel film 130_U. The upper vertical channel film 130_B may be in contact with the bit line pad BL_PAD.

The lower vertical structure VS_B may include a lower vertical channel film 130_B, a lower vertical insulating pattern 134_B, and a lower channel insulating film 132_BGI. The lower channel insulating film 132_BGI may be placed between the plurality of conductive lines GSL, WL$_0$ to WL$_n$, and DWL and the lower vertical channel film 130_B. The lower vertical insulating pattern 134_B may fill the space defined by the lower vertical channel film 130_B.

The vertical channel film 130 may include a lower vertical channel film 130_B and an upper vertical channel film 130_U. The lower vertical channel film 130_B is connected to the upper vertical channel film 130_U. The lower vertical channel film 130_B is in contact with the upper vertical channel film 130_U. The lower vertical channel film 130_B may include a connection region 130B_PAD being in contact with the upper vertical channel film 130_U, and an extension region 130B_CH extending in the third direction D3. The connection region 130B_PAD of the lower vertical channel film 130_B connects the extension region 130B_CH of the lower vertical channel film 130_B and the upper vertical channel film 130_U.

The extension region 130B_CH of the lower vertical channel film 130_B may include the diffused metal explained using FIGS. 2 to 4b. Since the connection region 130B_PAD of the lower vertical channel film 130_B is formed after the metal-induced crystallization process, the connection region 130B_PAD of the lower vertical channel film 130_B may include the aforementioned diffused metal.

The extension region 130B_CH of the lower vertical channel film 130_B and the connection region 130B_PAD of the vertical channel film 130_B may include polysilicon. Since the grain size of the extension region 130B_CH of the lower vertical channel film 130_B increases through the metal-induced crystallization process, the grain size of the connection region 130B_PAD of the vertical channel film 130_B is smaller than the grain size of the extension region 130B_CH of the lower vertical channel film 130_B.

The upper vertical channel film 130_U does not include the diffused metal explained using FIGS. 2 to 4b. When the upper vertical channel film 130_U includes polysilicon, the grain size of the upper vertical channel film 130_U may be smaller than the grain size of the extension region 130B_CH of the lower vertical channel film 130_B.

The vertical insulating pattern 134 may include an upper vertical insulating pattern 134_U and a lower vertical insulating pattern 134_B. The upper vertical insulating pattern 134_U and the lower vertical insulating pattern 134_B are spaced apart from each other. The upper vertical insulating pattern 134_U and the lower vertical insulating pattern 134_B are separated by the connection region 130B_PAD of the lower vertical channel film 130_B.

The lower vertical insulating pattern 134_B may include an outer region 134a_B and an inner region 134bB. Explanation of the lower vertical insulating pattern 134_B may be substantially the same as explanation of the vertical insulating pattern explained using FIGS. 2 to 4b.

The upper vertical insulating pattern 134_U may include an insulating material, and may include, for example, at least one of silicon oxide, silicon oxynitride, and a low-dielectric constant material. The upper vertical insulating pattern 134_U does not include the diffused metal explained using FIGS. 2 to 4b.

The upper channel insulating film 132_UGI may not be directly connected to the lower channel insulating film 132_BGI. The lower channel insulating film 132_BGI may include the tunnel insulating film 132a, the charge storage film 132b and the blocking insulating film 132c explained using FIGS. 4a and 4b. Although the upper channel insulating film 132_UGI is shown as a single film, the embodiment is not limited thereto. As an example, the upper channel insulating film 132_UGI may have the same structure as the lower channel insulating film 132_BGI. As another example, the upper channel insulating film 132_UGI may include silicon oxide. As still another example, the upper channel insulating film 132_UGI may have a double film structure including silicon oxide and a high-dielectric constant metal oxide.

Figure 12:
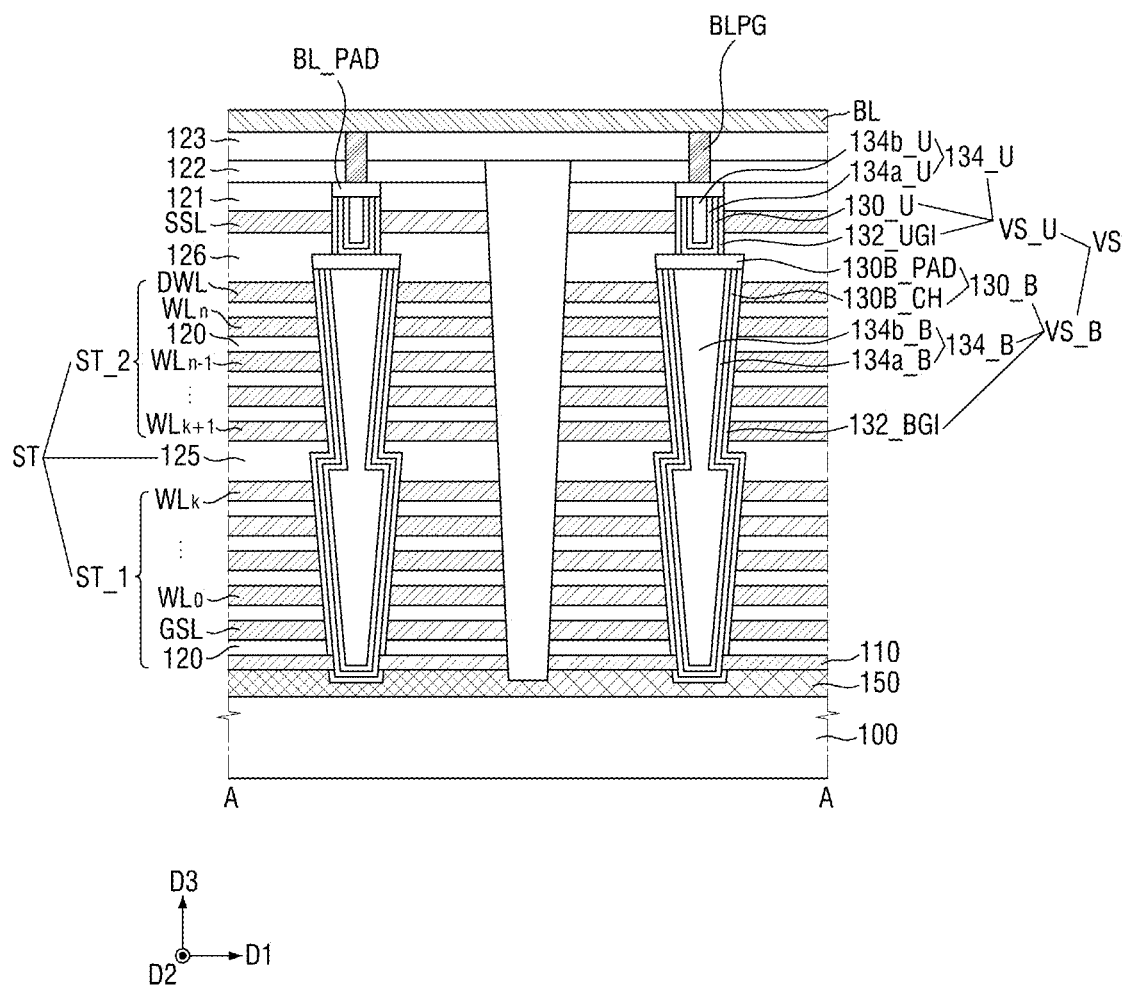
FIG. 12 is a diagram for explaining the semiconductor memory device according to some embodiments.

FIG. 12 is a diagram for explaining a semiconductor memory device according to some embodiments. For convenience of explanation, points different from those explained using FIGS. 10 and 11 will be mainly explained.

Referring to FIG. 12, in the semiconductor memory device according to some embodiments, the upper vertical insulating pattern 134_U and the upper vertical channel film 130_U may include a diffused metal.

The upper vertical insulating pattern 134_U may include an inner region 134b_U and an outer region 134a_U. The outer region 134a_U of the vertical insulating pattern may be formed along the profile of the upper vertical channel film 130_U. The sidewalls of the inner region 134b_U of the upper vertical insulating pattern may be covered with the outer region 134a_U of the upper vertical insulating pattern. The outer region 134a_U of the upper vertical insulating pattern may be placed between the upper vertical channel film 130_U and the inner region 134b_U of the upper vertical insulating pattern.

The outer region 134a_U of the upper vertical insulating pattern may be a filter film. The inner region 134b_U of the upper vertical insulating pattern may be a core pattern. The outer region 134a_U of the upper vertical insulating pattern may include an insulating material, and may include, for example, at least one of silicon oxide, silicon oxynitride, silicon nitride, and a high-dielectric constant metal oxide. The inner region 134b_U of the upper vertical insulating pattern may include, for example, at least one of silicon oxide, silicon oxynitride, and a low-dielectric constant material.

The outer region 134a_U of the upper vertical insulating pattern may include a diffused metal. The diffused metal in the outer region 134a_U of the upper vertical insulating pattern may be a metal diffused into the outer region 134a_U of the upper vertical insulating pattern during the metal-induced crystallization process.

As an example, the diffused metal included in the upper vertical insulating pattern 134_U may be the same as the diffused metal included in the lower vertical insulating pattern 134_B. As another example, the diffused metal included in the upper vertical insulating pattern 134_U is different from the diffused metal included in the lower vertical insulating pattern 134_B.

The upper vertical channel film 130_U includes a diffused metal included in the upper vertical insulating pattern 134_U. For example, the upper vertical channel film 130_U may include a metal silicide including the diffused metal included in the upper vertical insulating pattern 134_U. As another example, the upper vertical channel film 130_U may not include the metal silicide including the diffused metal included in the upper vertical insulating pattern 134_U.

While the metal-induced crystallization process of the upper vertical channel film 130_U is performed, some of the diffused metal included in the upper vertical insulating pattern 134_U may be diffused into the connection region 130B_PAD of the lower vertical channel film 130_B. Accordingly, while the metal-induced crystallization process of the upper vertical channel film 130_U is performed, the metal-induced crystallization process may be performed on at least a part of the connection region 130B_PAD of the lower vertical channel film 130_B.

Figure 13:
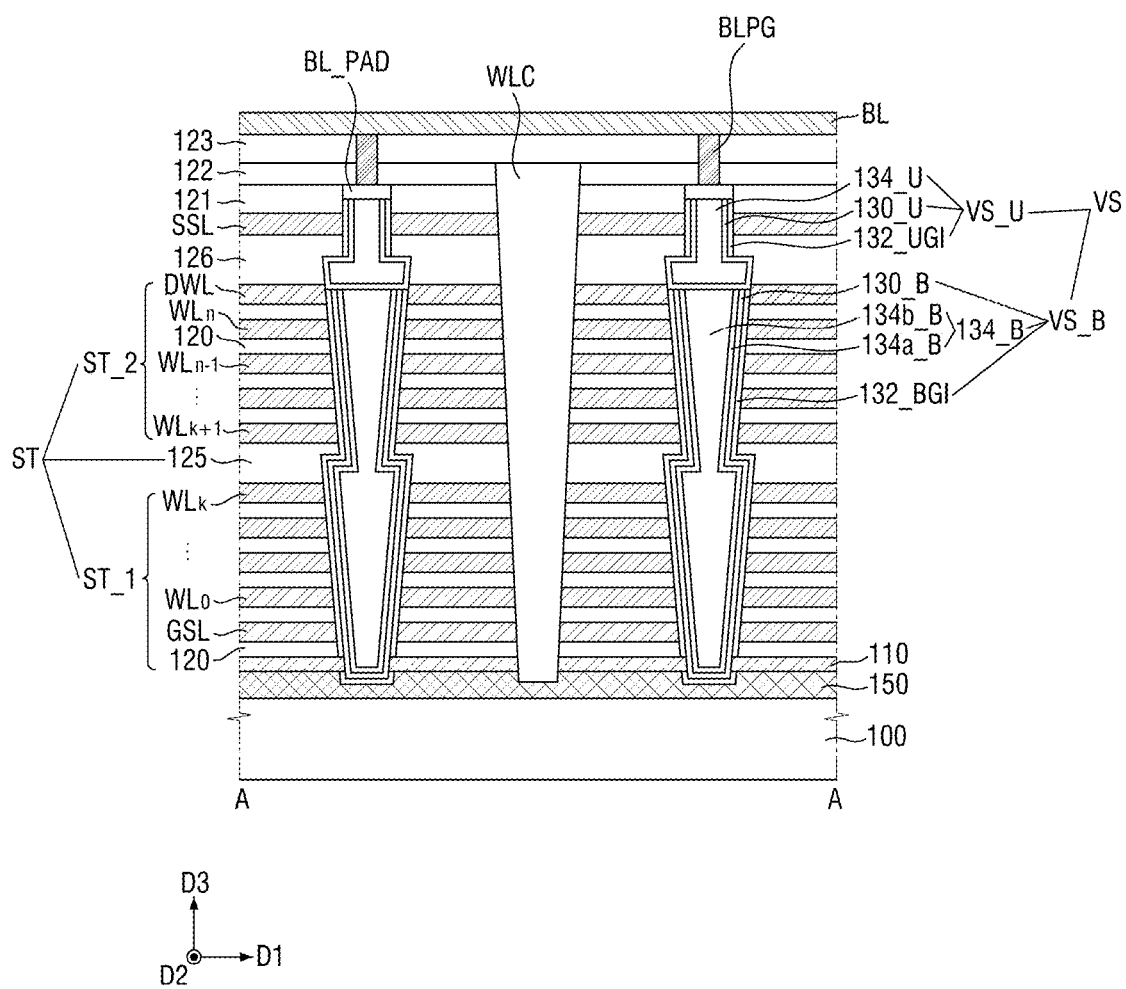
FIG. 13 is a diagram for explaining the semiconductor memory device according to some embodiments.

FIG. 13 is a diagram for explaining a semiconductor memory device according to some embodiments. For convenience of explanation, points different from those explained using FIGS. 10 and 11 will be mainly explained.

In the semiconductor memory device according to some embodiments shown in FIG. 13, the upper vertical insulating pattern 134_U may include a region in which a width is expanded in the first direction D1 between the string selection line SSL and the dummy word line DWL.

The upper vertical insulating pattern 134_U may have an inverted "T" shape.

The upper vertical channel film 130_U may include a first portion extending in the third direction D3 along the sidewalls of the string selection line SSL, a second portion extending in the third direction D3 in the inter-electrode insulating film 126, a third portion which connects the first portion and the second portion and extends in the first direction D1, and a fourth portion which is in contact with the lower vertical channel film 130_B and extends in the first direction D1. The fourth portion of the upper vertical channel film 130_U may separate the upper vertical insulating pattern 134_U from the lower vertical insulating pattern 134_B.

Figure 14:
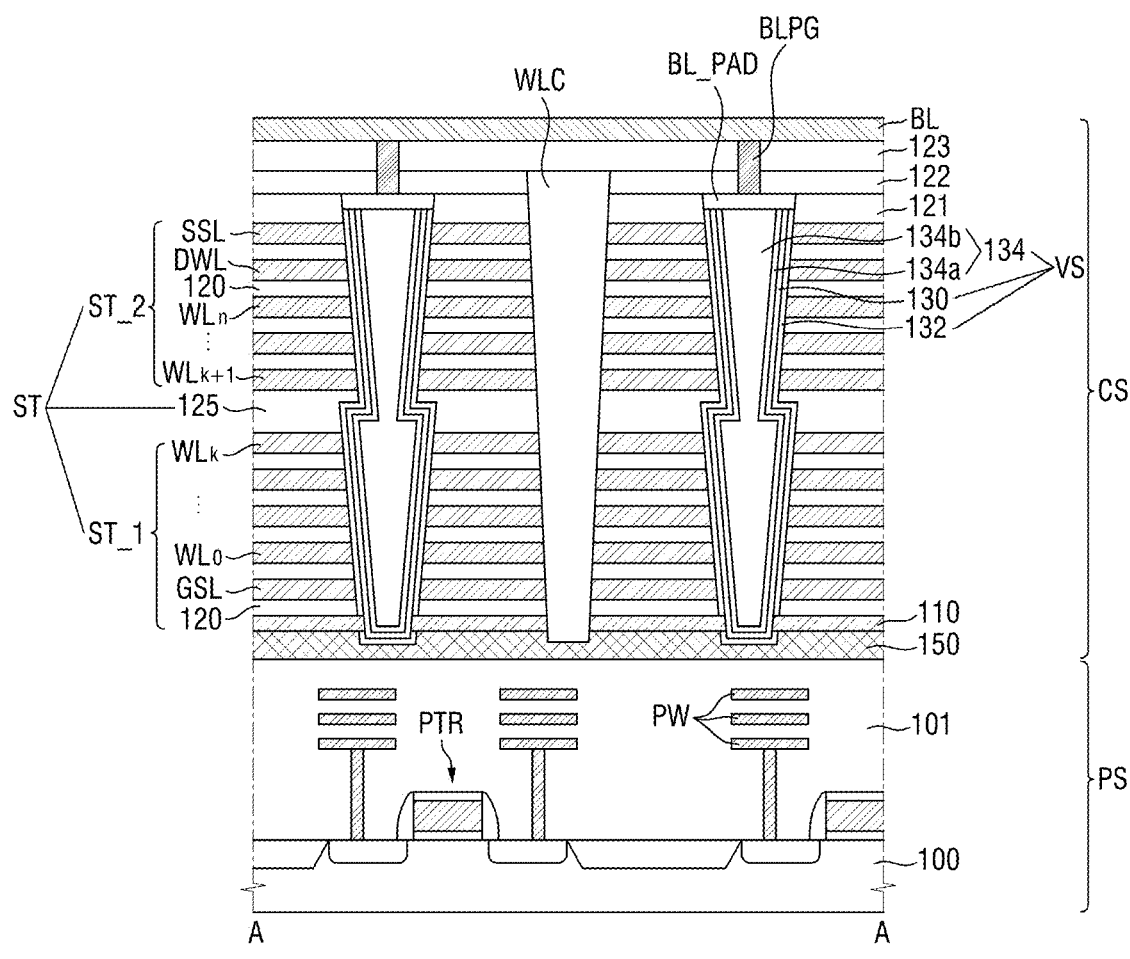
FIG. 14 is a diagram for explaining the semiconductor memory device according to some embodiments.

FIG. 14 is a diagram for explaining a semiconductor memory device according to some embodiments. For convenience of explanation, points different from those explained using FIGS. 2 to 4b will be mainly explained.

Referring to FIG. 14, the semiconductor memory device according to some embodiments may include a peripheral logic structure PS and a cell array structure CS.

The peripheral logic structure PS may include a peripheral circuit PTR, a lower connection wiring body PW, and a peripheral logic insulating film 101.

The peripheral circuit PTR may be formed on the substrate 100. The peripheral circuit PTR may be circuits that operate the cell array structure CS.

The peripheral logic insulating film 101 may be formed on the substrate 100. The peripheral logic insulating film 101 may include at least one of silicon oxide, silicon nitride, silicon oxynitride, and a low-dielectric constant material.

The lower connection wiring body PW may be formed in the peripheral logic insulating film 101. The lower connection wiring body PW may be connected to the peripheral circuit PTR.

The cell array structure CS may be placed on the peripheral logic structure PS. The cell array structure CS may include a stacked structure ST, a plurality of vertical structures VS, and a plurality of bit lines BL.

The horizontal conductive substrate 150 may extend along the upper surface of the peripheral logic structure PS. The horizontal conductive substrate 150 may extend along the upper surface of the peripheral logic insulating film 101.

Unlike the shown case, the bit line BL of the cell array structure CS may be adjacent to the peripheral logic structure PS. That is, the bit lines BL may be placed between the stacked structure ST and the peripheral logic structure PS.

FIGS. 15 to 19 are intermediate stage diagrams for explaining a method of fabricating a semiconductor memory device according to some embodiments. For reference, FIGS. 15 to 19 are associated with a cross-sectional view taken along a line A-A of FIG. 2.

Figure 15:
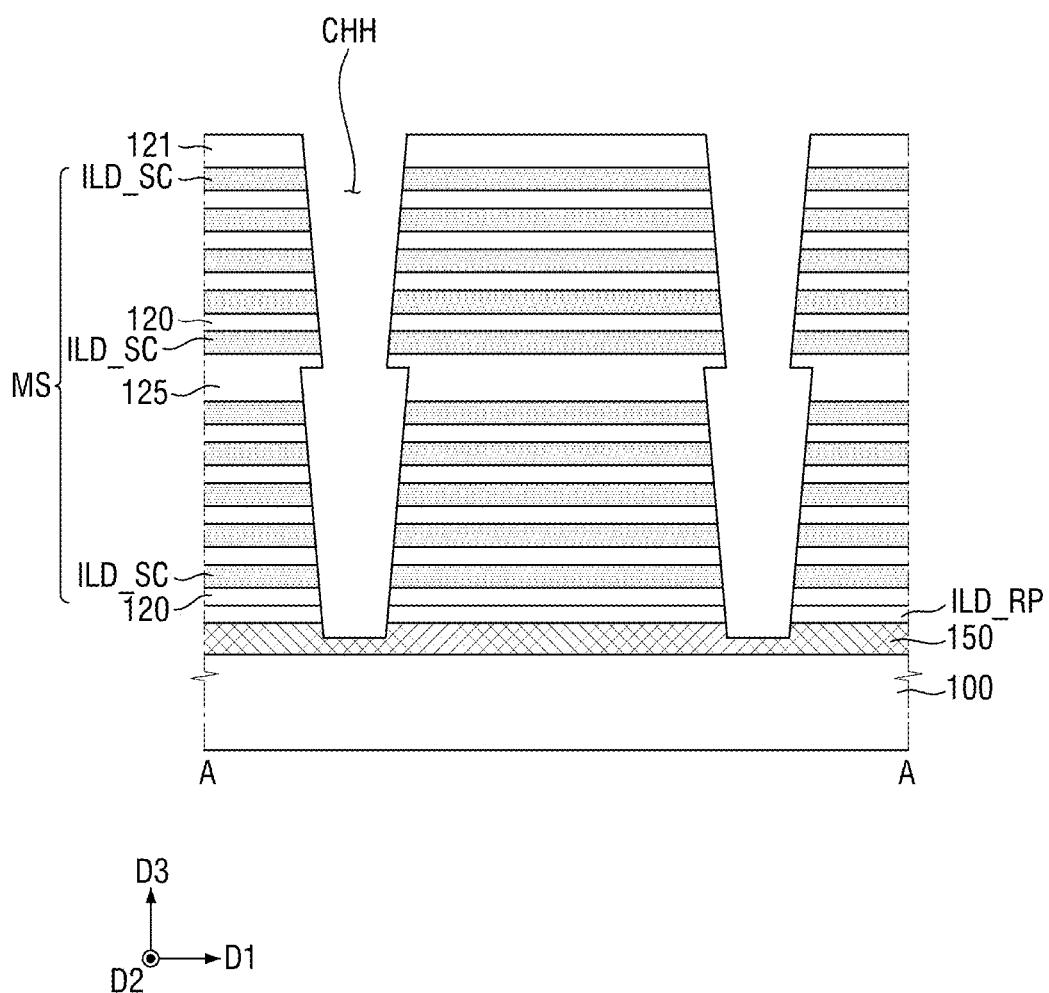
FIGS. 15 to 19 are intermediate stage diagrams for explaining a method of fabricating a semiconductor memory device according to some embodiments.

Referring to FIG. 15, a horizontal conductive substrate 150 and a replacement insulating film ILD_RP may be sequentially formed on the substrate 100.

A mold structure MS in which the inter-electrode insulating films 120 and 125 and the mold sacrificial films ILD_SC are alternately stacked may be formed on the replacement insulating film ILD_RP.

Next, a channel hole CHH may be formed in the mold structure MS.

More specifically, a part of the mold structure MS in which the inter-electrode insulating film 120 and the mold sacrificial film ILD_SC are alternately stacked may be formed on the replacement insulating film ILD_RP. Next, after forming a lower channel hole for forming a vertical structure (VS of FIG. 3), a sacrificial pattern may fill the lower channel hole.

After forming the sacrificial pattern, the rest of the mold structure MS in which the inter-electrode insulating films 120 and 125 and the mold sacrificial film ILD_SC are alternately stacked may be formed. A first interlayer insulating film 121 may be formed on the mold structure MS.

Next, an upper channel hole which is arranged in the lower channel hole and exposes the sacrificial pattern in the lower channel hole may be formed in the rest of the mold structure MS and in the first interlayer insulating film 121.

After removing the sacrificial pattern in the lower channel hole, a channel hole CHH in which the lower channel hole and the upper channel hole are connected may be formed.

Figure 16:
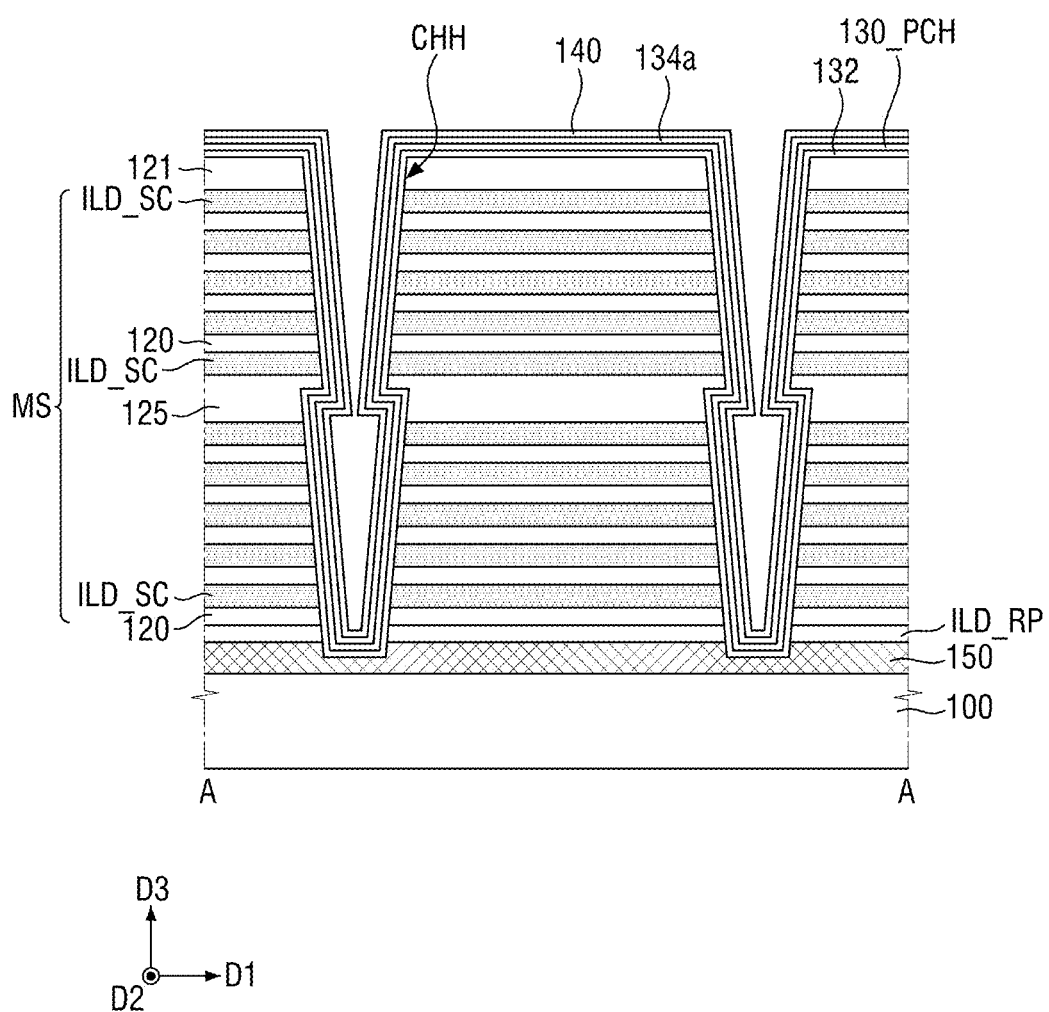

Referring to FIG. 16, the channel insulating film 132 may be formed along the profile of the channel hole CHH. The channel insulating film 132 may be formed on sidewalls and bottom surface of the channel hole CHH and on the upper surface of the first interlayer insulating film 121.

A pre channel film 130_PCH may be formed on the channel insulating film 132. The pre channel film 130_PCH may be formed along the profile of the channel insulating film 132. The pre channel film 130_PCH may be formed not only along the sidewalls of the channel hole CHH but also along the upper surface of the first interlayer insulating film 121.

The pre channel film 130_PCH may include a polycrystalline semiconductor material, and may include, for example, polysilicon.

A filter film 134a is formed on the pre channel film 130_PCH along the profile of the pre channel film 130_PCH. The filter film 134a may include the same material as an outer region (134a of FIG. 3) of the vertical insulating pattern.

A metal injection film 140 may be formed on the filter film 134a along the profile of the filter film 134a. The metal injection layer 140 may include a diffused metal to be used in the metal-induced crystallization process of the pre channel film 130_PCH. The metal injection film 140 may include, for example, at least one of gold (Au), aluminum (Al), copper (Cu), silver (Ag), palladium (Pd), nickel (Ni), platinum (Pt), manganese (Mn), rhodium (Rh), cobalt (Co), iron (Fe), chromium (Cr), titanium (Ti), niobium (Nb), iridium (Ir), tantalum (Ta), rhenium (Re), molybdenum (Mo), vanadium (V), hafnium (Hf), ruthenium (Ru), zirconium (Zr), tin (Sn), antimony (Sb) and tungsten (W).

Figure 17:
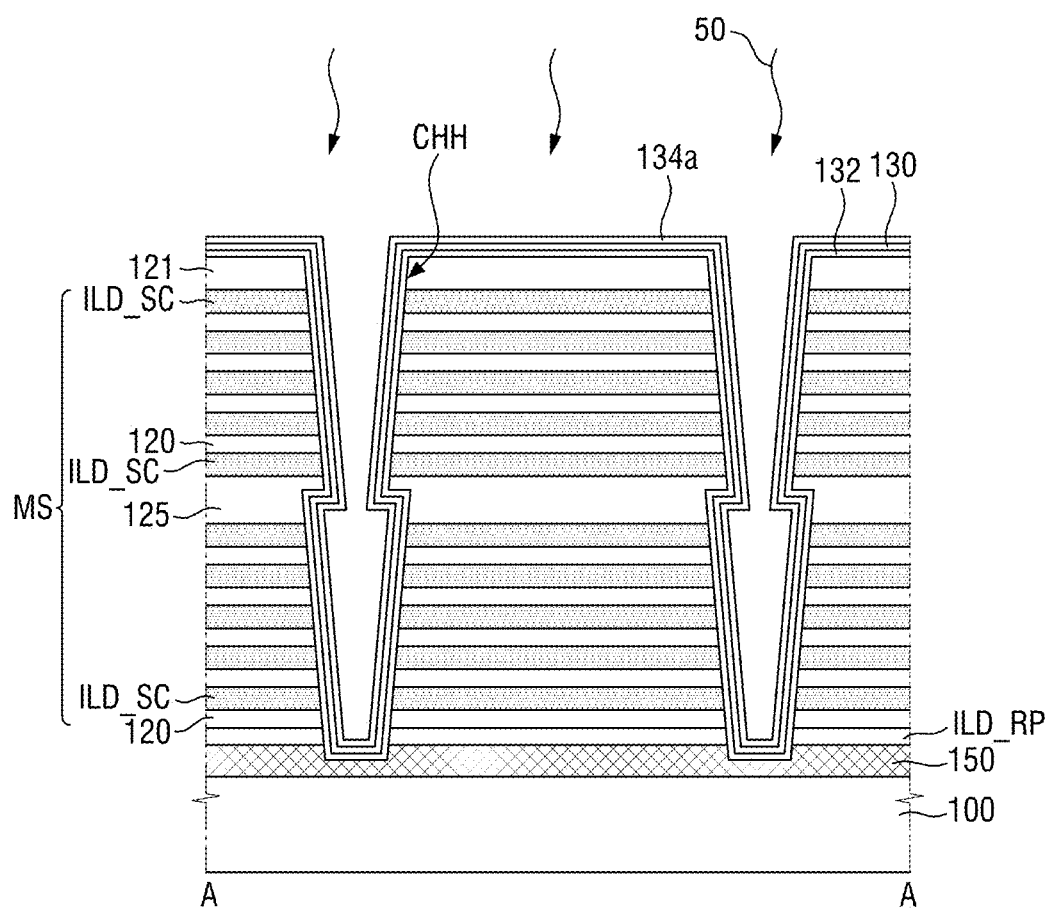

Referring to FIG. 17, the vertical channel film 130 may be formed, using the pre channel film 130_PCH through the heat treatment 50 of the metal injection film 140.

More specifically, the diffused metal in the metal injection film 140 may be diffused into the filter film 134a and the pre channel film 130_PCH through the heat treatment 50 of the metal injection film 140. The diffused metal diffused into the pre channel film 130_PCH passes through the filter film 134a.

A metal-induced crystallization process may be performed by the diffused metal diffused into the pre channel film 130_PCH while the heat treatment 50 is performed. The grain size of the polycrystalline silicon included in the pre channel film 130_PCH may increase through the metal-induced crystallization process. The vertical channel film 130 may be formed between the channel insulating film 132 and the filter film 134a accordingly.

As an example, the metal injection layer 140 may be diffused and enter the filter film 134a and the pre channel film 130_PCH while the heat treatment 50 is performed. As another example, a part of the metal injection film 140 may remain on the filter film 134a after the heat treatment 50 is completed. The rest of the metal injection film 140 on the filter film 134a may be metal particles (ME_RP of FIG. 5).

Figure 18:
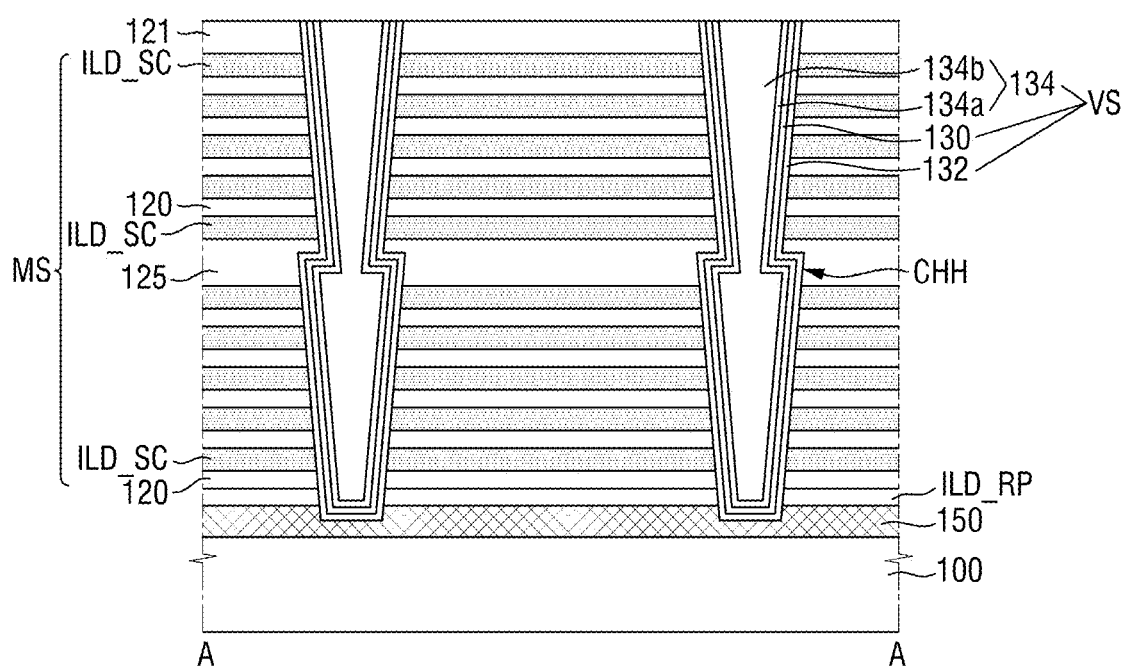
Figure 18:
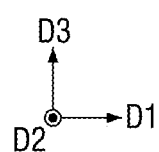

Referring to FIG. 18, a core pattern 134b which fills the channel hole CHH is formed on the filter film 134a. The vertical insulating pattern 134 including the filter film 134a and the core pattern 134b may be formed in the channel hole CHH accordingly.

That is, the vertical structure VS including the channel insulating film 132, the vertical channel film 130 and the vertical insulating pattern 134 is formed in the channel hole CHH.

While the vertical insulating pattern 134 is formed, the filter film 134a, the vertical channel film 130, and the channel insulating film 132 formed on the upper surface of the first interlayer insulating film 121 may be removed.

When the filter film 134a is removed before forming the core pattern 134b, defects may be induced in the vertical channel film 130 and/or the channel insulating film 132. By forming the core pattern 134a with the filter film 134a left, it is possible to limit and/or prevent degradation of reliability of the vertical channel film 130 and/or the channel insulating film 132.

Figure 19:
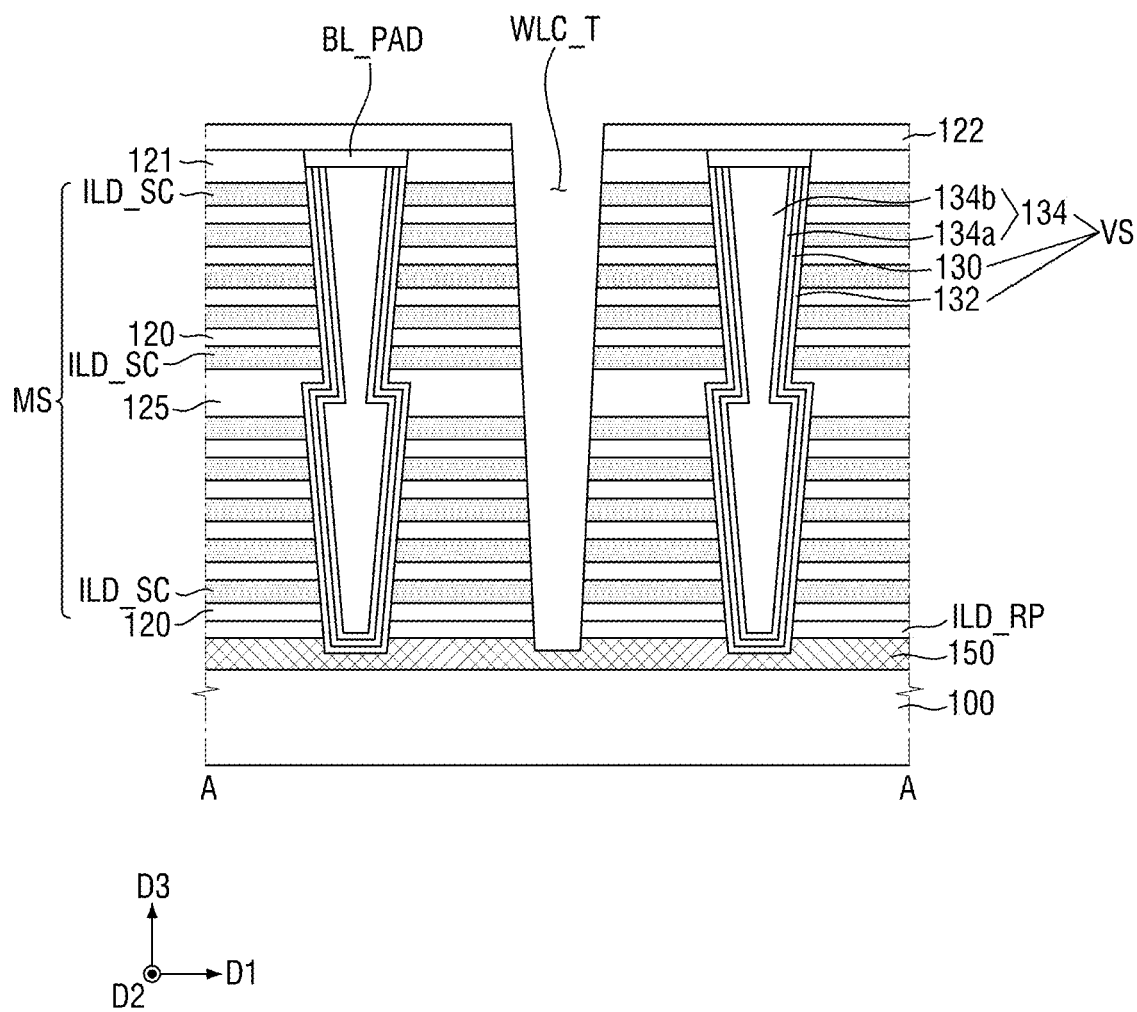

Referring to FIG. 19, a part of the vertical structure VS may be removed to form a bit line pad BL_PAD in the channel hole CHH.

Next, a second interlayer insulating film 122 may be formed on the bit line pad BL_PAD and the first interlayer insulating film 121.

Next, a cut line trench WLC_T which penetrates the mold structure MS, the first interlayer insulating film 121 and the second interlayer insulating film 122 may be formed.

Referring to FIG. 3, after forming the cut line trench WCL_T, the replacement insulating film ILD_RP may be removed. A vertical structure support film 110 may be formed in the space from which the replacement insulating film ILD_RP is removed.

After forming the cut line trench WCL_T, the mold sacrificial film ILD_SC may be removed. The conductive lines GSL, WL$_0$ to WL$_n$, DWL, and SSL may be formed in the space from which the mold sacrificial film ILD_SC is removed.

In other words, the mold sacrificial film ILD_SC may be replaced with the conductive lines GSL, WL$_0$ to WL$_n$, DWL, and SSL through a replacement metal gate process.

Subsequently, an insulating line WLC which fills the cut line trench WCL_T may be formed.

Unlike the shown case, a semiconductor material film for forming the string selection line (SSL of FIGS. 10 and 12) may be formed on the vertical structure VS. In such a case, the semiconductor material film may also be cut when forming the cut line trench WCL_T.

Figure 20:
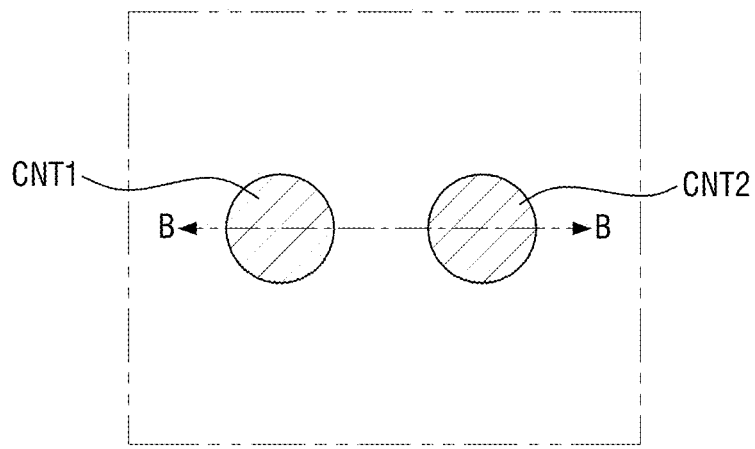
FIG. 20 is a schematic layout view for explaining a semiconductor device according to some embodiments.
Figure 20:
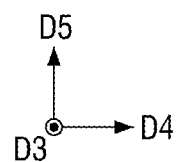
Figure 21:
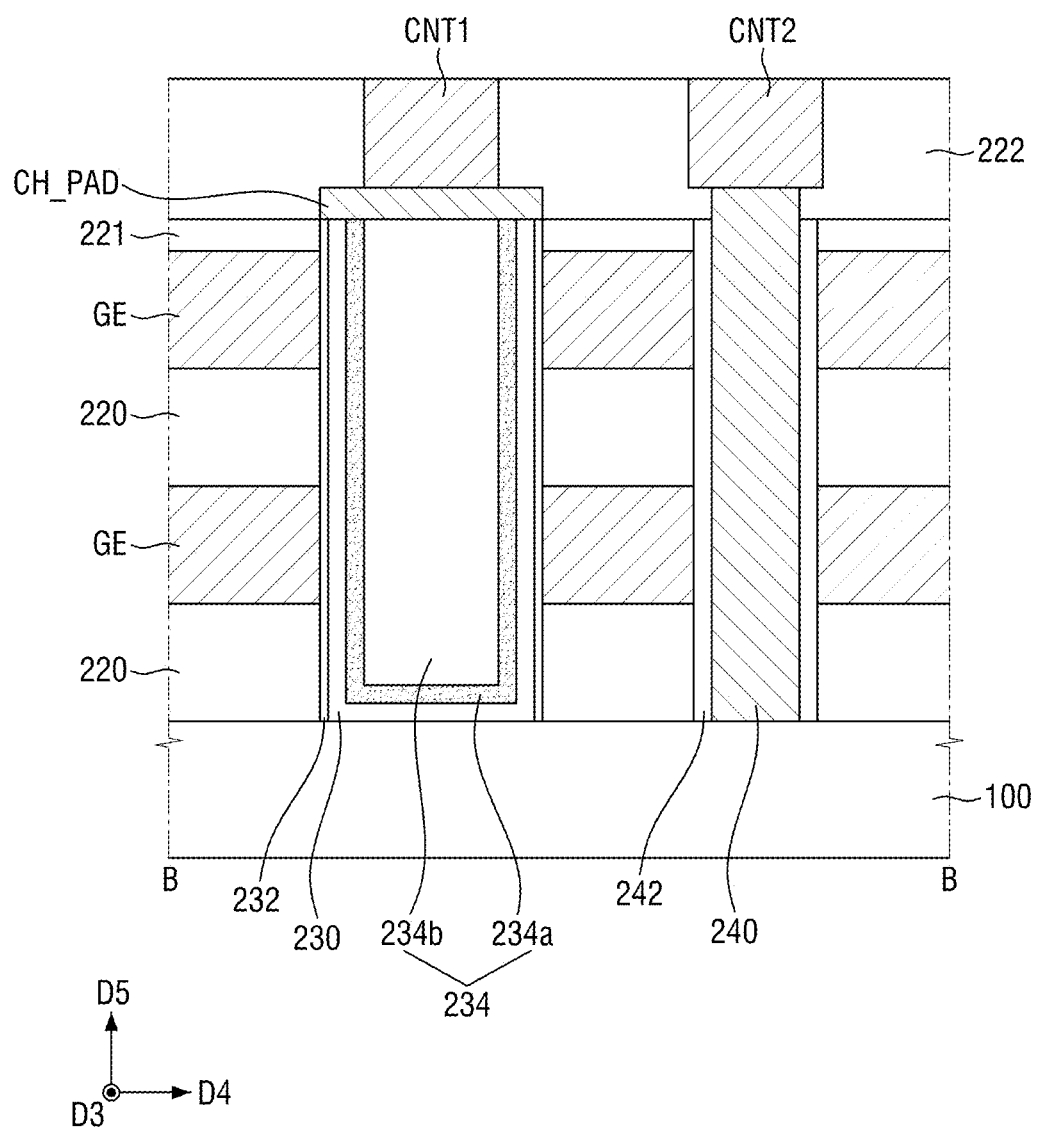
FIGS. 21 and 22 are example cross-sectional views taken along a line B-B of FIG. 22, respectively.
Figure 22:
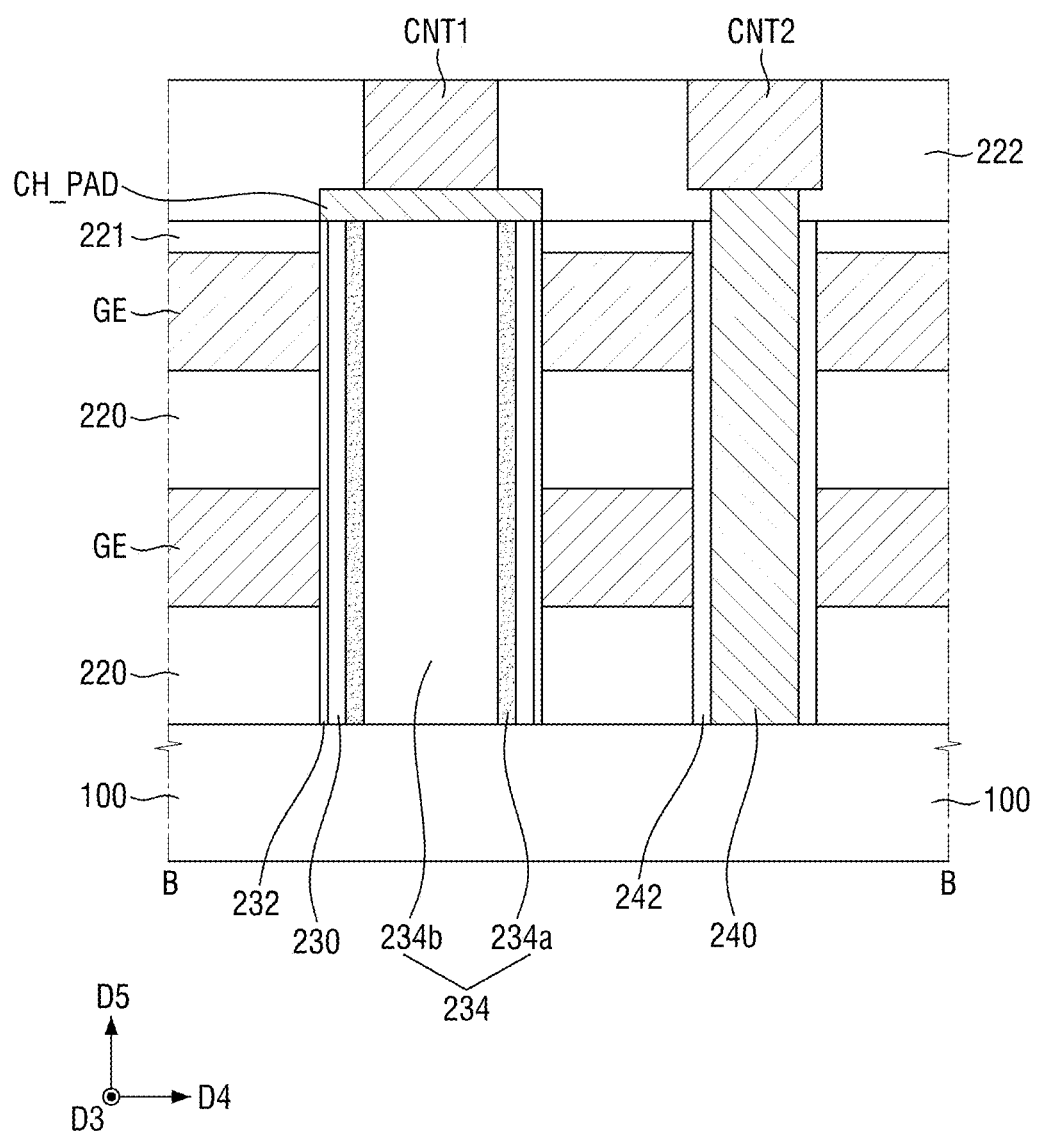

FIG. 20 is a schematic layout view for explaining a semiconductor device according to some embodiments. FIGS. 21 and 22 are example cross-sectional views taken along a line B-B of FIG. 20.

Referring to FIGS. 20 to 22, the semiconductor device according to some embodiments may include a gate electrode GE, a vertical element channel film 230, a vertical element insulating pattern 234, and a source/drain connection pattern 240.

The gate electrode GE may be placed on the substrate 100. The gate electrode GE may be spaced apart from the substrate 100 in a third direction D3. The third direction D3 may be parallel to the thickness direction of the substrate 100. The gate electrode GE may extend alongside the fourth direction D4 and/or the fifth direction D5.

The gate electrode GE may include, for example, at least one of a metal, a metal alloy, a conductive metal nitride, a conductive metal oxide, a conductive metal oxynitride, a metal silicide, and a conductive semiconductor material.

Although the two gate electrodes GE spaced apart from each other in the third direction D3 on the substrate 100 are shown, the number thereof is not limited thereto. The number of gate electrodes GE spaced apart from the substrate 100 in the third direction D3 may be one or three or more.

The gate separation insulating film 220 may be placed between the substrate 100 and the gate electrode GE. The gate separation insulating film 220 may be placed between the gate electrodes GE adjacent to each other in the third direction D3. When there is a plurality of gate electrodes GE, the gate separation insulating film 220 and the gate electrode GE may be alternately placed on the substrate 100.

The gate capping insulating film 221 may be placed on the gate electrode GE placed on the uppermost part among the gate electrodes GE placed on the substrate 100.

The gate separation insulating film 220 and the gate capping insulating film 221 may include, for example, an insulating material.

The vertical element channel film 230 may extend in the third direction D3. The vertical element channel film 230 may penetrate the gate separation insulating film 220, the gate electrode GE and the gate capping insulating film 221 stacked on the substrate 100.

The vertical element channel film 230 may be electrically connected to the substrate 100. Although not shown, the substrate 100 may include a source/drain region. The uppermost part of the vertical element channel film 230 may be placed on the same plane as the upper surface of the gate capping insulating film 221.

In FIG. 21, the vertical element channel film 230 may have a cylindrical shape. For example, the vertical element channel film 230 may include a bottom part extending along the upper surface of the substrate 100, and sidewall parts extending from the bottom part in the third direction D3.

In FIG. 22, the vertical element channel film 230 may not include a bottom extending along the upper surface of the substrate 100.

The vertical element channel film 230 may include a semiconductor material, for example, such as silicon (Si), germanium (Ge) or mixtures thereof. The vertical element channel film 230 may include a polycrystalline semiconductor material.

The vertical element channel film 230 includes a diffused metal included in the vertical element insulating pattern 234. Explanation thereof may be substantially the same as explanation of the vertical element channel film 230.

The gate insulating film 232 may be placed between the vertical element channel film 230 and the gate electrode GE, and between the vertical element channel film 230 and the gate separation insulating film 220. The gate insulating film 232 may include, for example, at least one of silicon oxide, silicon oxynitride, silicon nitride, and a high-dielectric constant metal oxide.

The vertical element insulating pattern 234 may fill the space defined by the vertical element channel film 330. The vertical element channel film 230 may extend along sidewalls of the vertical element insulating pattern 234. The vertical element insulating pattern 234 may be in contact with the vertical element channel film 230.

The vertical element insulating pattern 234 may include an inner region 234b and an outer region 234a. The outer region 234a of the vertical element insulating pattern may be an element filter film. The inner region 234b of the vertical element insulating pattern may be an element core pattern.

The vertical element insulating pattern 234 may include a diffused metal. The upper surface of the vertical element insulating pattern 234 may be placed on the same plane as the upper surface of the gate capping insulating film 221.

In FIG. 21, the outer region 234a of the vertical element insulating pattern may include a portion extending along the upper surface of the substrate 100. That is, a part of the outer region 234a of the vertical element insulating pattern may be placed between the bottom surface of the inner region 234b of the vertical element insulating pattern and the upper surface of the substrate 100.

Unlike the case shown in FIG. 21, the vertical element channel film 230 may not extend along the bottom surface of the vertical element insulating pattern 234. That is, the vertical element channel film 230 may not include a bottom part that extends along the upper surface of the substrate 100.

In FIG. 22, the outer region 234a of the vertical element insulating pattern may not include a portion that extends along the upper surface of the substrate 100.

Additionally, the diffused metal included in the vertical element channel film 230 and the outer region 234a of the vertical element insulating pattern may also be included in the substrate 100. In the fabricating process for the metal-induced crystallization process, some of the diffused metal may be diffused into the substrate 100.

Explanation of the vertical element insulating pattern 234 may be substantially the same as explanation of the vertical insulating pattern 134 explained using FIGS. 4a and 4b. Unlike the shown case, explanation of the vertical element insulating pattern 234 may be substantially the same as explanation of the vertical insulating pattern 134 explained using FIG. 5. As another example, explanation of the vertical element insulating pattern 234 may be substantially the same as explanation of the vertical insulating pattern 134 explained using FIG. 6.

The source/drain connection pattern 240 may extend in the third direction D3. The source/drain connection pattern 240 may penetrate the gate separation insulating film 220, the gate electrode GE and the gate capping insulating film 221 stacked on the substrate 100.

The source/drain connection pattern 240 may be electrically connected to the vertical element channel film 230. The upper surface of the source/drain connection pattern 240 may protrude in the third direction D3 beyond the upper surface of the gate capping insulating film 221. Unlike the shown case, as an example, the upper surface of the source/drain connection pattern 240 may be placed on the same plane as the upper surface of the gate capping insulating film 221.

The source/drain connection pattern 240 may include, for example, at least one of a metal, a metal alloy, a conductive metal nitride, a conductive metal oxide, a conductive metal oxynitride, a metal silicide, and a conductive semiconductor material.

The connection pattern insulating film 242 may extend along the sidewalls of the source/drain connection pattern 240. The connection pattern insulating film 242 may electrically insulate the connection pattern insulating film 242 and the gate electrode GE. The connection pattern insulating film 242 may include, for example, an insulating material.

An element channel pad CH_PAD may be placed on the vertical element insulating pattern 234. The element channel pad CH_PAD may be connected to the vertical element channel film 230.

The element channel pad CH_PAD may include, for example, at least one of metal, metal alloy, conductive metal nitride, conductive metal oxide, conductive metal oxynitride, metal silicide, and conductive semiconductor material.

A fourth interlayer insulating film 222 may be placed on the source/drain connection pattern 240 and the element channel pad CH_PAD. The fourth interlayer insulating film 222 may include, for example, but is not limited to, at least one of silicon oxide, silicon oxynitride, and a low-dielectric constant material.

The first source/drain contact CNT1 and the second source/drain contact CNT2 may be placed in the fourth interlayer insulating film 222. The first source/drain contact CNT1 may be connected to the element channel pad CH_PAD. The second source/drain contact CNT2 may be connected to the source/drain connection pattern 240.

The first source/drain contact CNT1 and the second source/drain contact CNT2 may connect the element channel pad CH_PAD, and a wiring structure formed in a BEOL (Back-End-Of-Line) process.

The first source/drain contact CNT1 and the second source/drain contact CNT2 mat include, for example, at least one of metal, metal alloy, conductive metal nitride, conductive metal oxide, conductive metal oxynitride, metal silicide, and a conductive semiconductor material, respectively.

Unlike the aforementioned case, the source/drain connection pattern 240 and the element channel pad CH_PAD may be connected to the wiring structure formed in the BEOL (Back-End-Of-Line) process, without the first source/drain contact CNT1 and the second source/drain contact CNT2. In such a case, the first source/drain contact CNT1 and the second source/drain contact CNT2 may be omitted.

FIGS. 23 to 29 are intermediate stage diagrams for explaining a method of fabricating a semiconductor device according to some embodiments. For reference, FIGS. 23 to 29 may be intermediate stage diagrams taken along a line B-B of FIG. 20.

Figure 23:
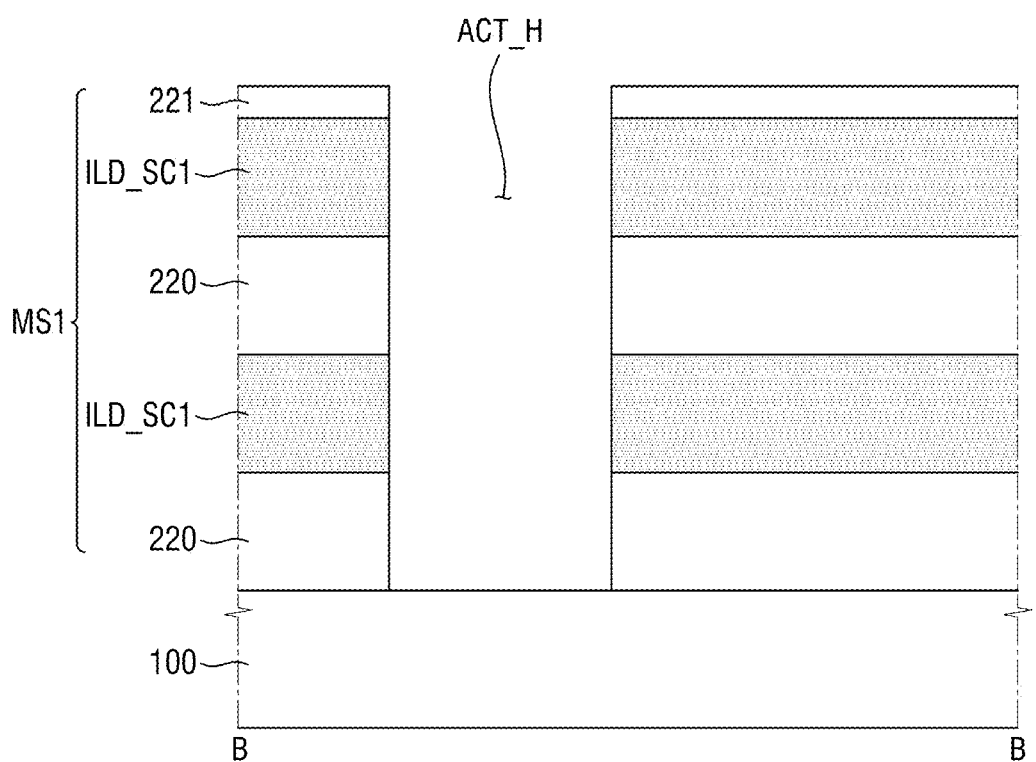
FIGS. 23 to 29 are intermediate stage diagrams for explaining a method of fabricating a semiconductor device according to some embodiments.

Referring to FIG. 23, a first mold structure MS1 may be formed on the substrate 100. The first mold structure MS1 may include a gate separation insulating film 220 and a gate mold sacrificial film ILD_SC1 stacked on the substrate 100. The first mold structure MS1 may include a gate capping insulating film 221 placed on the uppermost part.

Next, an active hole ACT_H may be formed in the first mold structure MS1. The active hole ACT_H may penetrate the first mold structure MS1.

Figure 24:
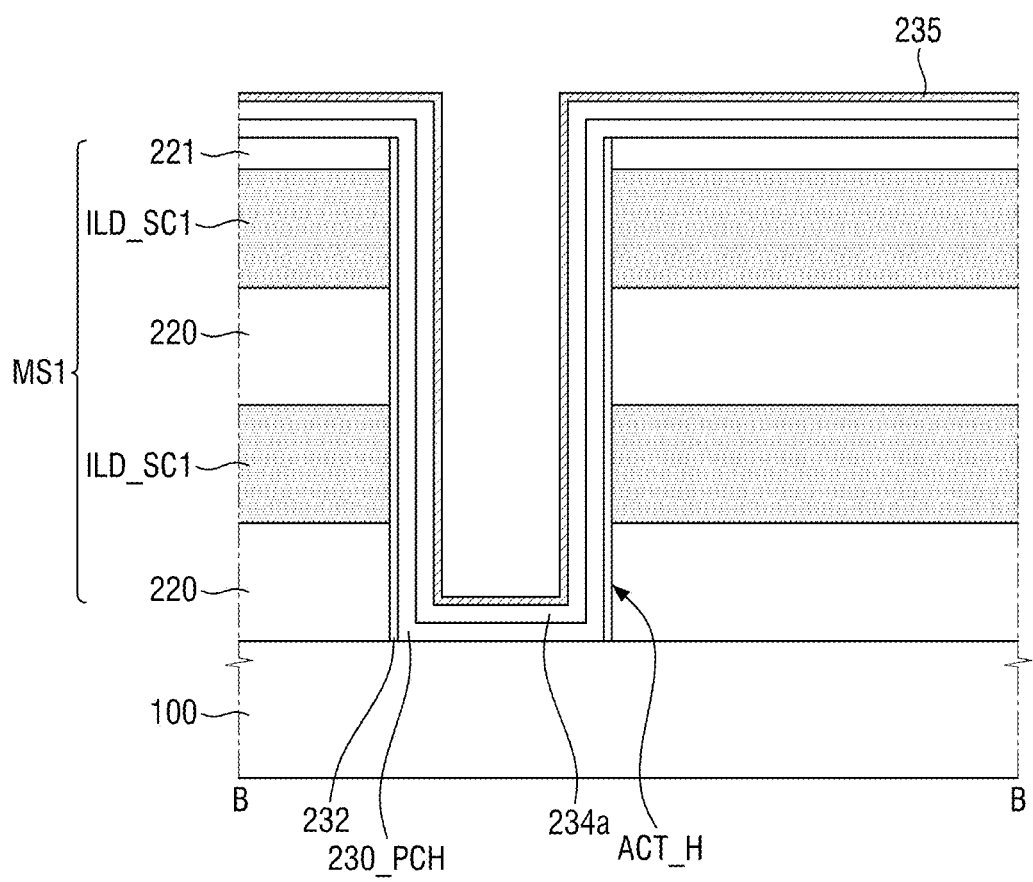

Referring to FIG. 24, the gate insulating film 232 may be formed along the sidewalls of the active hole ACT_H.

Next, a pre element channel film 230_PCH may be formed on the gate insulating film 232. The pre element channel film 230_PCH may be formed along the sidewalls and bottom surface of the active hole ACT_H. The pre element channel film 230_PCH may be formed not only along the sidewalls of the active hole ACT_H, but also along the upper surface of the gate capping insulating film 221.

The pre element channel film 230_PCH may include a polycrystalline semiconductor material, and may include, for example, polysilicon.

An element filter film 234a is formed on the pre element channel film 230_PCH along the profile of the pre element channel film 130_PCH. The element filter film 234a may include the same material as the outer region (234a of FIG. 21) of the vertical element insulating pattern.

An element metal injection film 235 may be formed on the element filter film 234a along the profile of the element filter film 234a. The element metal injection film 235 may include a diffused metal to be used in the metal-induced crystallization process of the pre element channel film 230_PCH.

Unlike the shown case, the pre element channel film 230_PCH is formed on the sidewalls of the active hole ACT_H, but may not be formed on the bottom surface of the active hole ACT_H.

Unlike the shown case, the element filter film 234a is formed on the sidewalls of the active hole ACT_H, but may not be formed on the bottom surface of the active hole ACT_H.

Figure 25:
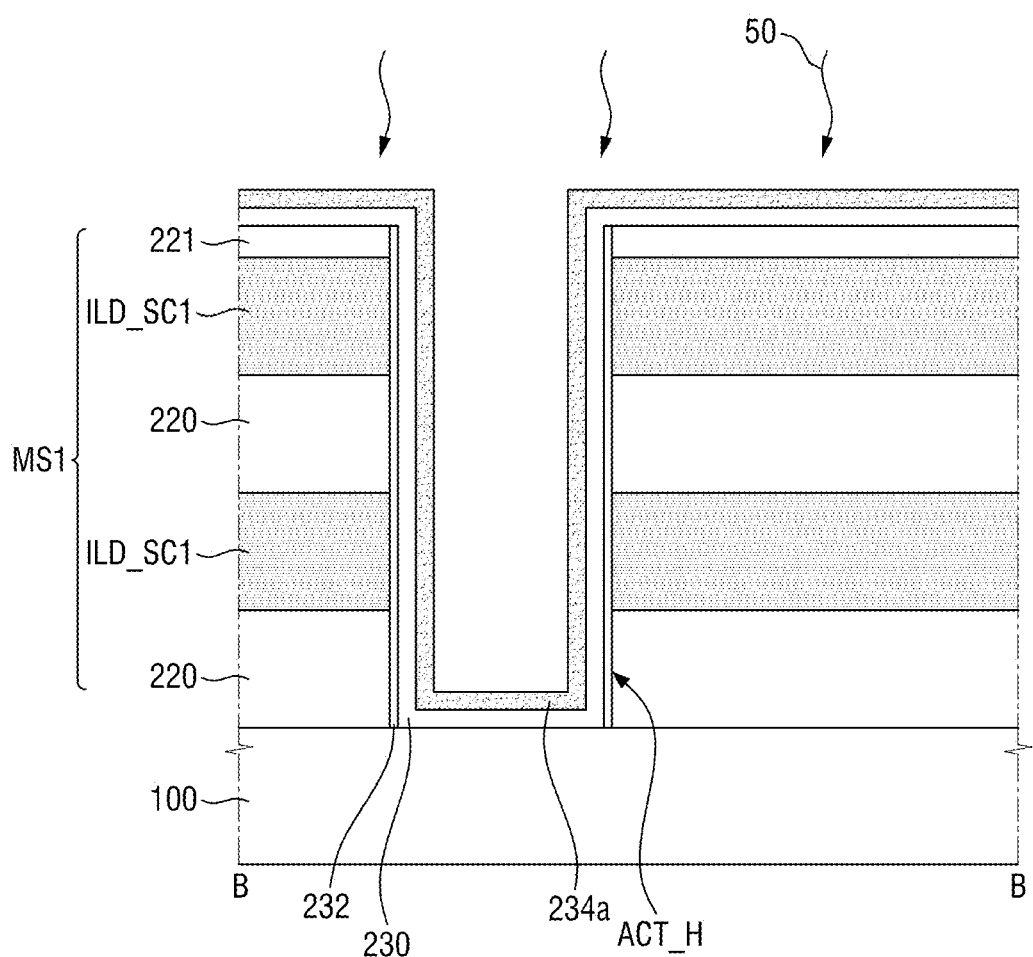

Referring to FIG. 25, the vertical element channel film 230 may be formed using the pre element channel film 230_PCH through the heat treatment 50 of the element metal injection film 235.

Formation of the vertical element channel film 230 using the pre element channel film 230_PCH may be substantially the same as that explained using FIG. 17.

Figure 26:
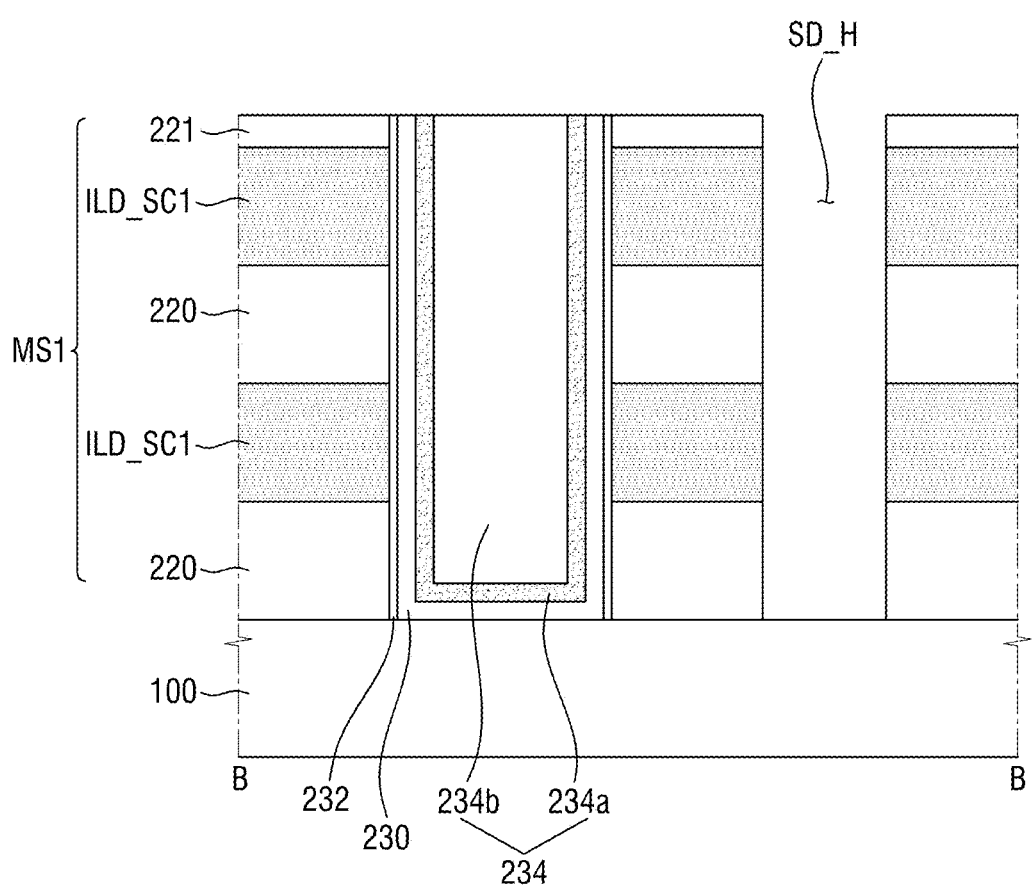

Referring to FIG. 26, an element core pattern 234b which fills the active hole ACT_H is formed on the element filter film 234a. As a result, the vertical element insulating pattern 234 including the element filter film 234a and the element core pattern 234b may be formed in the active hole ACT_H.

The element filter film 234a and the vertical element channel film 230 formed on the upper surface of the gate capping insulating film 221 may be removed, while the vertical element insulating pattern 234 is being formed.

Next, a source/drain hole SD_H may be formed in the first mold structure MS1. The source/drain hole SD_H may penetrate the first mold structure MS1.

Figure 27:
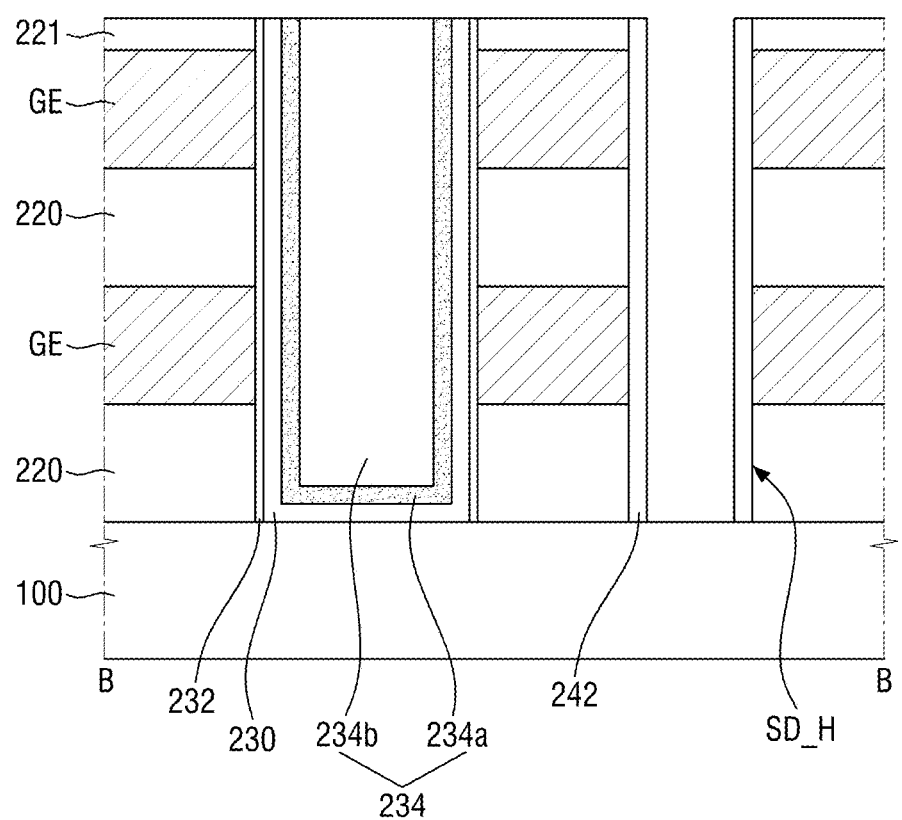

Referring to FIGS. 26 and 27, the gate mold sacrificial film ILD_SC1 may be removed. A gate electrode GE may be formed in the space from which the gate mold sacrificial film ILD_SC1 is removed.

Next, a connection pattern insulating film 242 may be formed along the sidewalls of the source/drain holes SD_H.

Figure 28:
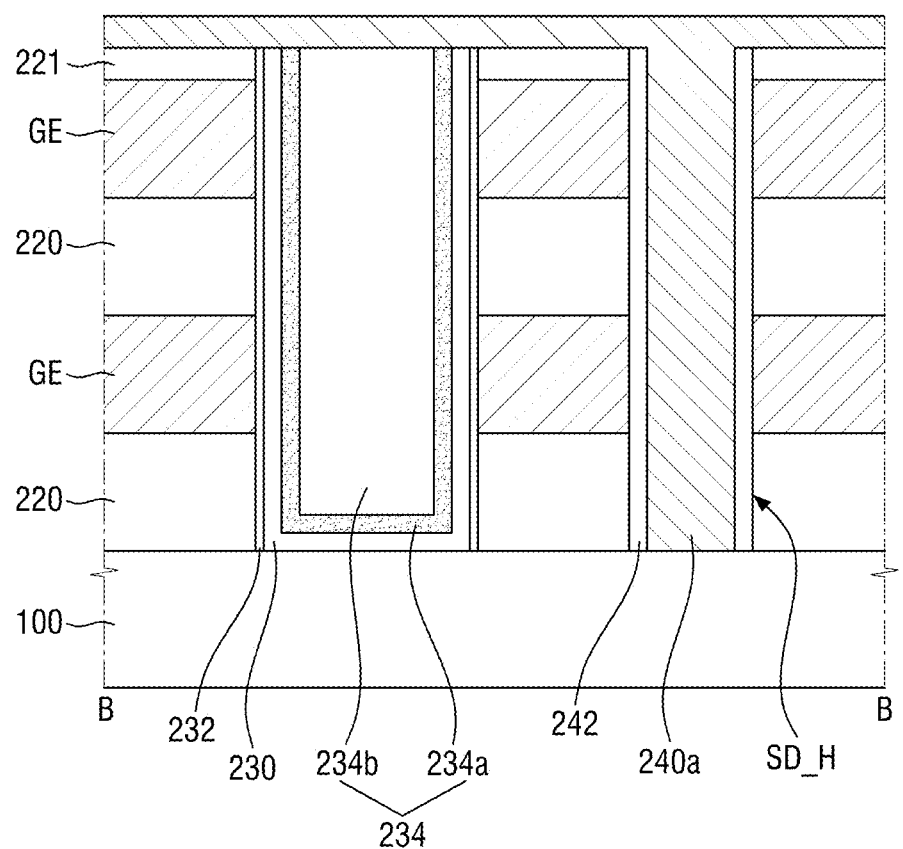

Referring to FIG. 28, the source/drain connection film 240a that fills the source/drain hole SD_H may be formed.

The source/drain connection film 240a may be formed on the upper surface of the gate capping insulating film 221 and the upper surface of the vertical element insulating pattern 234.

Figure 29:
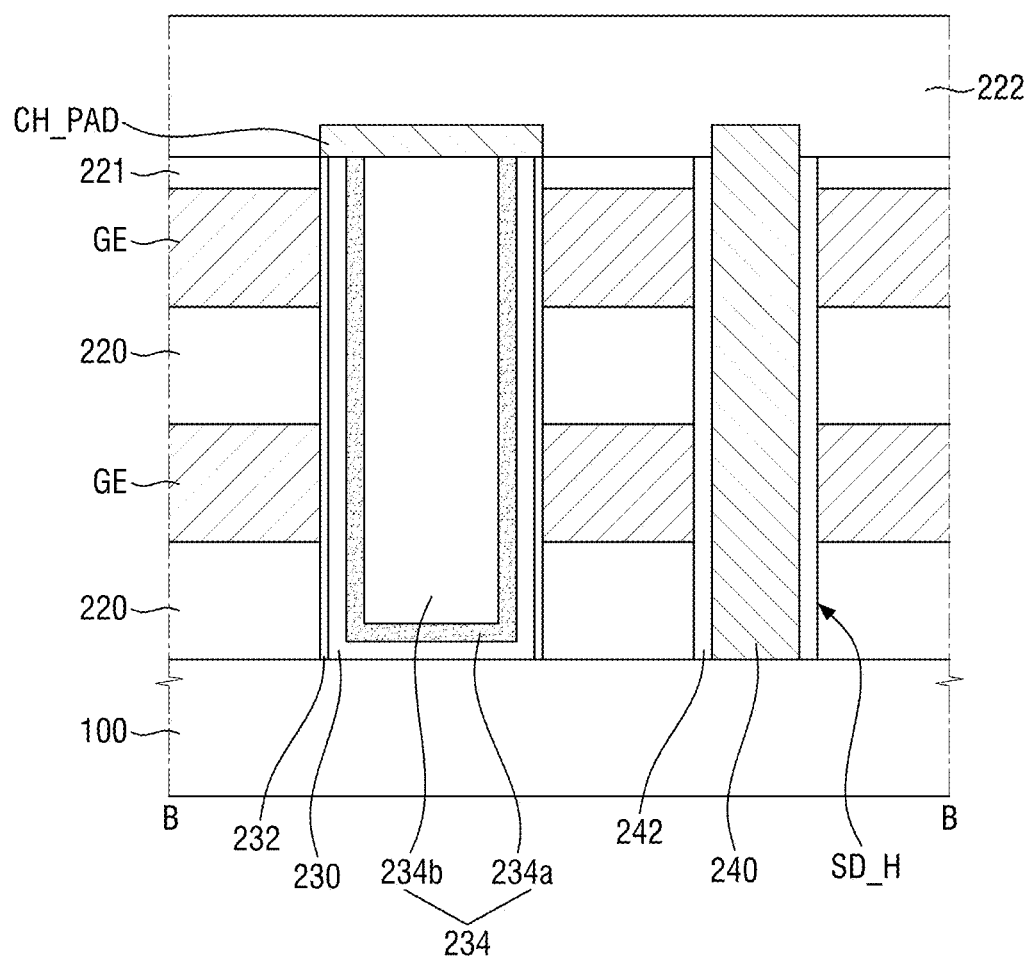

Referring to FIGS. 28 and 29, by etching—back a part of the source/drain connection film 240a, thickness of the source/drain connection film 240a extending along the upper surface of the gate capping insulating film 221 may be reduced.

Next, the source/drain connection film 240a may be patterned to form the element channel pad CH_PAD and the source/drain connection pattern 240.

Unlike the shown case, the etch-back process for reducing the thickness of the source/drain connection film 240a may not be performed.

Unlike the shown case, by removing the source/drain connection film 240a on the upper surface of the gate capping insulating film 221, the source/drain connection pattern 240 may be formed in the source/drain hole SD_H. Subsequently, the element channel pad CH_PAD may be formed. As an example, the source/drain pad may be formed on the source/drain connection pattern 240 while the element channel pad CH_PAD is being formed. As another example, the source/drain pad may not be formed on the source/drain connection pattern 240 while the element channel pad CH_PAD is being formed.

A fourth interlayer insulating film 222 may be formed on the element channel pad CH_PAD and the source/drain connection pattern 240.

Next, a first source/drain contact CNT1 and a second source/drain contact CNT2 may be formed in the fourth interlayer insulating film 222.

While some example embodiments have been described, the presented embodiments of the disclosure are to be used in a generic and descriptive sense only and not for purposes of limitation. Those skilled in the art will appreciate that many variations and modifications may be made to embodiments of inventive concepts without substantially departing from the principles of inventive concepts in the present disclosure as defined by the following claims.

What is claimed is:

1. A semiconductor memory device comprising:
   a substrate;
   a stacked structure on the substrate, the stacked structure including a plurality of conductive lines stacked on the substrate; and
   a vertical structure penetrating the stacked structure, the vertical structure including a vertical insulating pattern and a channel film extending along sidewalls of the vertical insulating pattern,
   the vertical insulating pattern including an inner region and an outer region,
   the outer region of the vertical insulating pattern being between the channel film and the inner region of the vertical insulating pattern, and
   the outer region of the vertical insulating pattern including an insulating material and a diffused metal in addition to the insulating material, wherein the channel film includes the diffused metal,
   wherein each of the inner region of the vertical insulating pattern and the outer region of the vertical insulating pattern include silicon oxide.

2. The semiconductor memory device of claim 1, wherein the channel film includes metal silicide, and the metal silicide includes the diffused metal.

3. The semiconductor memory device of claim 1, wherein the vertical insulating pattern is a single film.

4. The semiconductor memory device of claim 1, further comprising:
   metal particles in the vertical insulating pattern, wherein the metal particles includes the diffused metal, and
   the metal particles are part of a discontinuous pattern along a boundary between the outer region of the vertical insulating pattern and the inner region of the vertical insulating pattern.

5. The semiconductor memory device of claim 1, wherein the vertical structure includes a lower vertical structure and an upper vertical structure on the lower vertical structure, the vertical insulating pattern includes a lower vertical insulating pattern and an upper vertical insulating pattern, which are spaced apart from each other, the lower vertical structure includes the lower vertical insulating pattern, and the upper vertical structure includes the upper vertical insulating pattern.

6. The semiconductor memory device of claim 5, wherein the lower vertical insulating pattern and the upper vertical insulating pattern include the diffused metal.

7. The semiconductor memory device of claim 5, wherein the lower vertical insulating pattern includes the diffused metal, and the upper vertical insulating pattern does not include the diffused metal.

8. The semiconductor memory device of claim 1, further comprising:

a peripheral logic structure on the substrate and including a peripheral circuit; and a horizontal conductive substrate extending along an upper surface of the peripheral logic structure, wherein the stacked structure is on the horizontal conductive substrate, and the plurality of conductive lines are stacked on the horizontal conductive substrate.

9. The semiconductor memory device of claim 8, further comprising:

metal particles in the vertical insulating pattern, wherein the metal particles include the diffused metal, and the metal particles are part of a discontinuous pattern along a boundary between the outer region of the vertical insulating pattern and the inner region of the vertical insulating pattern.

10. The semiconductor memory device of claim 1, wherein the diffused metal lowers a crystallization temperature of the channel film, such that the channel film including the diffused metal has a lower crystallization temperature compared to a channel film not including the diffused metal.

11. A semiconductor memory device comprising:

a substrate;

a stacked structure on the substrate, the stacked structure including a plurality of conductive lines stacked on the substrate;

a vertical structure penetrating the stacked structure, the vertical structure including a vertical insulating pattern and a channel film extending along sidewalls of the vertical insulating pattern; and metal particles in the vertical insulating pattern, wherein the vertical insulating pattern includes an insulating material and a diffused metal in addition to the insulating material, the channel film includes a metal silicide including the diffused metal, an inner region of the vertical insulating pattern includes silicon oxide, an outer region of the vertical insulating pattern is disposed between the channel film and the inner region of the vertical insulating pattern, the outer region of the vertical insulating pattern includes at least one of silicon nitride and silicon oxynitride, the metal particles include the diffused metal, and the metal particles are part of a discontinuous pattern along a boundary between the outer region of the vertical insulating pattern and the inner region of the vertical insulating pattern.

12. The semiconductor memory device of claim 11, wherein the outer region of the vertical insulating pattern includes the diffused metal.

13. A semiconductor memory device comprising:

a substrate;

a stacked structure on the substrate, the stacked structure including a plurality of conductive lines stacked on the substrate;

a vertical structure penetrating the stacked structure, the vertical structure including a vertical insulating pattern and a channel film extending along sidewalls of the vertical insulating pattern;

metal particles in the vertical insulating pattern, wherein the vertical insulating pattern includes an inner region and an outer region, the outer region of the vertical insulating pattern is between the channel film and the inner region of the vertical insulating pattern, the outer region of the vertical insulating pattern includes an insulating material and a diffused metal in addition to the insulating material, the channel film includes the diffused metal, the inner region of the vertical insulating pattern includes silicon oxide, the insulating material of the outer region of the vertical insulating pattern includes at least one of silicon nitride and silicon oxynitride, the metal particles include the diffused metal, and the metal particles are part of a discontinuous pattern along a boundary between the outer region of the vertical insulating pattern and the inner region of the vertical insulating pattern.

* * * * *